US012288780B2

(12) United States Patent
Choi et al.

(10) Patent No.: US 12,288,780 B2
(45) Date of Patent: Apr. 29, 2025

(54) SEMICONDUCTOR PACKAGE

(71) Applicant: SAMSUNG ELECTRONICS CO., LTD., Suwon-si (KR)

(72) Inventors: Ju-Youn Choi, Hwaseong-si (KR); Kyoung Lim Suk, Suwon-si (KR); Wonjae Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/824,194

(22) Filed: May 25, 2022

(65) Prior Publication Data
US 2023/0075833 A1    Mar. 9, 2023

(30) Foreign Application Priority Data

Sep. 3, 2021   (KR) .................. 10-2021-0117852

(51) Int. Cl.
| | |
|---|---|
| *H01L 25/18* | (2023.01) |
| *H01L 23/00* | (2006.01) |
| *H01L 23/48* | (2006.01) |
| *H01L 23/538* | (2006.01) |
| *H01L 23/552* | (2006.01) |

(52) U.S. Cl.
CPC ............ *H01L 25/18* (2013.01); *H01L 23/481* (2013.01); *H01L 23/5383* (2013.01); *H01L 23/5385* (2013.01); *H01L 23/5386* (2013.01); *H01L 23/552* (2013.01); *H01L 24/16* (2013.01); *H01L 2224/16227* (2013.01); *H01L 2924/014* (2013.01)

(58) Field of Classification Search
CPC .............. H01L 23/526; H01L 23/5383; H01L 23/5385; H01L 23/5386; H01L 23/50; H01L 24/11; H01L 2224/16137; H01L 25/18; H01L 25/03; H01L 25/0652
See application file for complete search history.

(56) References Cited

U.S. PATENT DOCUMENTS

| | | |
|---|---|---|
| 10,192,810 B2 | 1/2019 | Karhade et al. |
| 10,867,982 B1 | 12/2020 | Yu et al. |
| 11,018,124 B2 | 5/2021 | Collins |
| 2014/0117552 A1* | 5/2014 | Qian ................... H01L 23/5383 257/E23.141 |
| 2018/0130761 A1 | 5/2018 | Kim et al. |
| 2019/0348360 A1* | 11/2019 | Kim ..................... H01L 23/5386 |

(Continued)

*Primary Examiner* — Ictor A Mandala
*Assistant Examiner* — Lawrence C Tynes, Jr.
(74) *Attorney, Agent, or Firm* — Morgan, Lewis & Bockius LLP

(57) ABSTRACT

A semiconductor package including: a package substrate; an interposer on the package substrate; a chip stack on the interposer, the chip stack including a plurality of first semiconductor chips that are stacked in a first direction; a second semiconductor chip on the interposer and spaced apart from the chip stack in a second direction intersecting the first direction; and a first signal pad, a second signal pad, and a power/ground pad on a top surface of the interposer, wherein the chip stack is mounted on the first signal pad, wherein the second semiconductor chip is mounted on the second signal pad, wherein the chip stack and the second semiconductor chip are connected to the power/ground pad, and wherein the power/ground pad overlaps a portion of the chip stack and a portion of the second semiconductor chip.

33 Claims, 19 Drawing Sheets

(56) References Cited

U.S. PATENT DOCUMENTS

2021/0159177 A1 5/2021 Tsai et al.
2021/0167015 A1 6/2021 Qian et al.
2021/0175176 A1 6/2021 Ji et al.

* cited by examiner

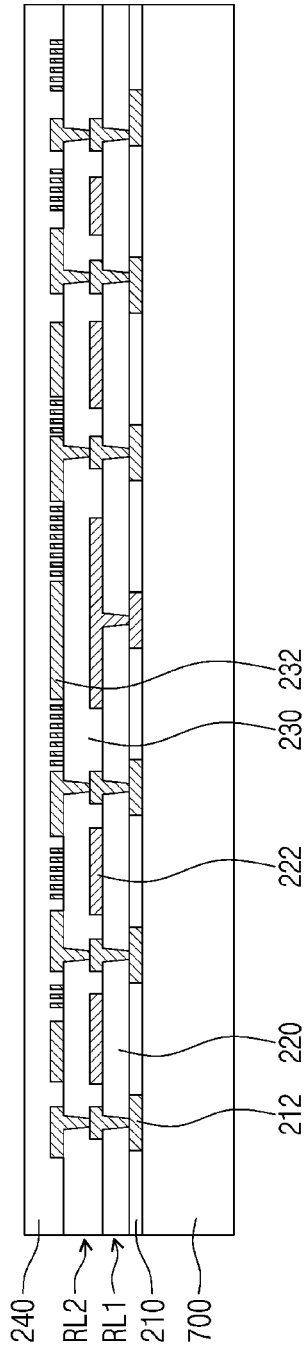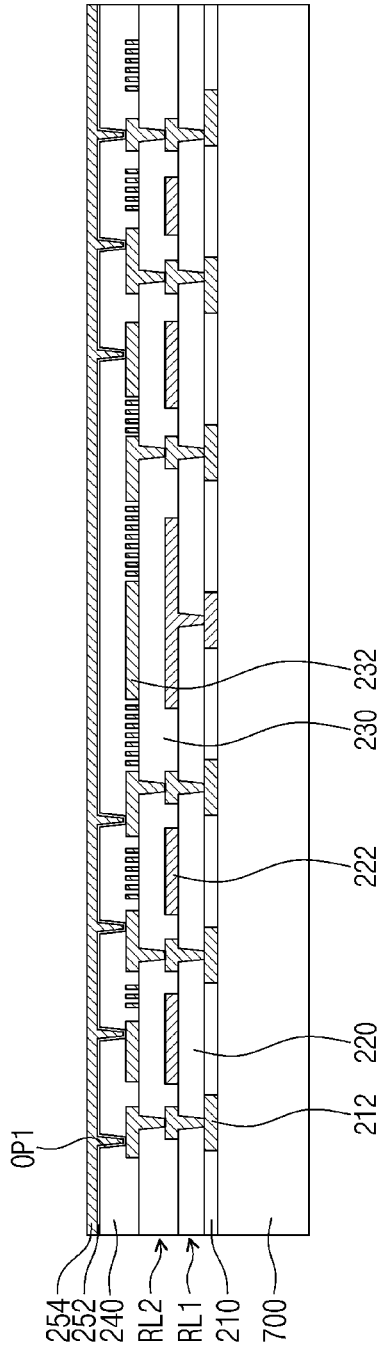

SEMICONDUCTOR PACKAGE

CROSS-REFERENCE TO RELATED APPLICATION

This U.S. nonprovisional application claims priority under 35 U.S.C. § 119 to Korean Patent Application No. 10-2021-0117852, filed on Sep. 3, 2021, in the Korean Intellectual Property Office, the disclosure of which is incorporated by reference herein in its entirety.

1. TECHNICAL FIELD

The present inventive concept relate to a semiconductor package and a method of fabricating the same, and more particularly, to a stacked semiconductor package and a method of fabricating the same.

2. DESCRIPTION OF THE RELATED ART

Electronics manufacturers are under constant pressure to produce electronic devices that satisfy demands for high performance, high speed, and compact size. To manufacture such devices, a packaging technology in which a plurality of semiconductor chips are mounted in a single package may be employed.

Portable electronic devices have seen remarkable demand, and as a result, the electronic components in these devices require reductions in size and weight. To accomplish this, a technology to integrate a number of individual devices into a single package as well as a technology to reduce individual sizes of the devices is needed. In particular, a semiconductor package in which a plurality of devices are integrated should have a compact size, improved thermal characteristics, and excellent electrical properties.

Since there are a plurality of semiconductor chips and semiconductor apparatuses embedded in an integrated circuit board, and since there is an increase in the operating speed of the semiconductor chips, cross coupling may occur between signals. Such cross coupling may negatively impact signal integrity. In addition, electromagnetic interference (EMI) may occur between the semiconductor chips. Such electromagnetic interference may induce malfunctions of the semiconductor chips and semiconductor apparatuses.

SUMMARY

Some embodiments of the present inventive concept provide a semiconductor package with increased electrical properties.

Some embodiments of the present inventive concept provide a compact-sized semiconductor package.

According to some embodiments of the present inventive concept, a semiconductor package may include: a package substrate; an interposer on the package substrate; a chip stack on the interposer, the chip stack including a plurality of first semiconductor chips that are stacked in a first direction; a second semiconductor chip on the interposer and spaced apart from the chip stack in a second direction intersecting the first direction; and a first signal pad, a second signal pad, and a power/ground pad on a top surface of the interposer, wherein the chip stack is mounted on the first signal pad, wherein the second semiconductor chip is mounted on the second signal pad, wherein the chip stack and the second semiconductor chip are connected to the power/ground pad, and wherein the power/ground pad overlaps a portion of the chip stack and a portion of the second semiconductor chip.

According to some embodiments of the present inventive concept, a semiconductor package may include: a package substrate; an interposer on the package substrate; a chip stack on the interposer, the chip stack including a plurality of first semiconductor chips that are stacked on each other; and a second semiconductor chip on the interposer and spaced apart from the chip stack, wherein the interposer includes: a first wiring layer that has a power/ground pattern; a second wiring layer on the first wiring layer, the second wiring layer having a signal pattern; and a first signal pad and a first power/ground pad disposed on the second wiring layer and on which the chip stack is mounted; a second signal pad and a second power/ground pad disposed on the second wiring layer and on which the second semiconductor chip is mounted; and a connection pattern that electrically connects the first power/ground pad to the second power/ground pad, wherein the signal pattern of the second wiring layer overlaps the connection pattern.

According to some embodiments of the present inventive concept, a semiconductor package may include: a package substrate; an interposer on the package substrate; a chip stack on the interposer, the chip stack including a plurality of memory chips that are stacked in a first direction; and a logic chip on the interposer and spaced apart from the chip stack in a second direction different from the first direction, wherein the chip stack and the logic chip are on signal pads of the interposer, wherein a first power/ground terminal of the chip stack and a second power/ground terminal of the logic chip are connected to an intermediate pattern of the interposer, wherein the signal pads and the intermediate pattern protrude from a top surface of the interposer, and wherein top surfaces of the signal pads are at a level the same as a level of a top surface of the intermediate pattern.

According to some embodiments of the present inventive concept, a semiconductor package may include: an interposer on a package substrate; a chip stack on the interposer; and a semiconductor chip on the interposer and horizontally spaced apart from the chip stack, wherein the interposer includes: a first wiring layer that has a power/ground pattern; a second wiring layer on the first wiring layer, the second wiring layer having a signal pattern; a first signal pad and a first power/ground pad disposed on the second wiring layer and on which the chip stack is mounted; a second signal pad and a second power/ground pad disposed on the second wiring layer and on which the semiconductor chip is mounted; and an intermediate pattern between the first power/ground pad and the second power/ground pad, the intermediate pattern being electrically connected to the first and second power/ground pads, wherein the signal pattern of the second wiring layer vertically overlaps the intermediate pattern, and wherein the first and second signal pads, the first and second power/ground pads, and the intermediate pattern have top surfaces at the same level.

BRIEF DESCRIPTION OF THE DRAWINGS

FIGS. 14, 15, 16, 17, 18, 19 and 20 are cross-sectional views showing a method of fabricating a semiconductor package according to some embodiments of the present inventive concept.

DETAILED DESCRIPTION OF THE EMBODIMENTS

The following will now describe a semiconductor package according to some embodiments of the present inventive concept with reference to the accompanying drawings.

Figure 1:
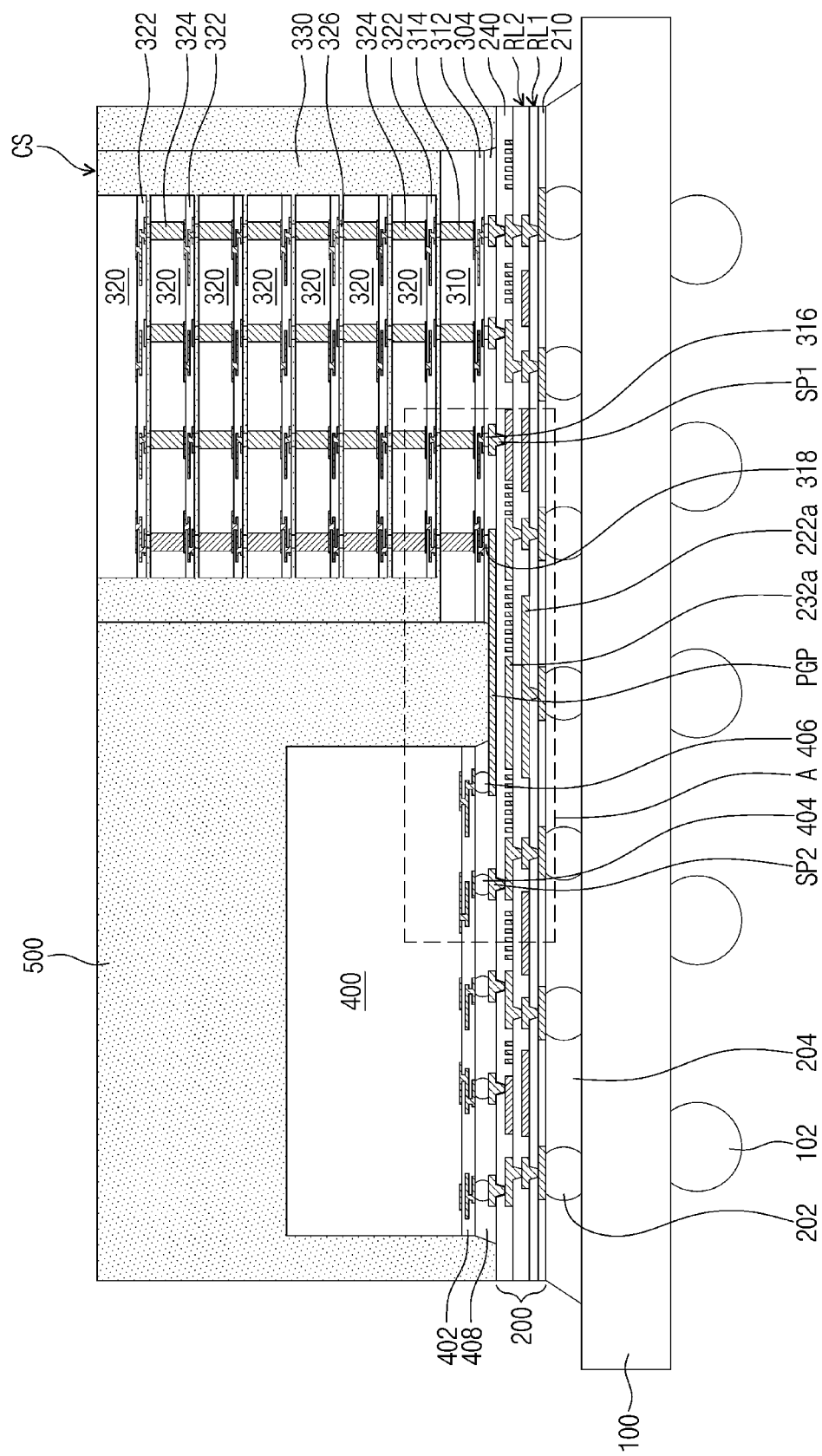
FIG. 1 is a cross-sectional view showing a semiconductor package according to some embodiments of the present inventive concept.
Figure 2:
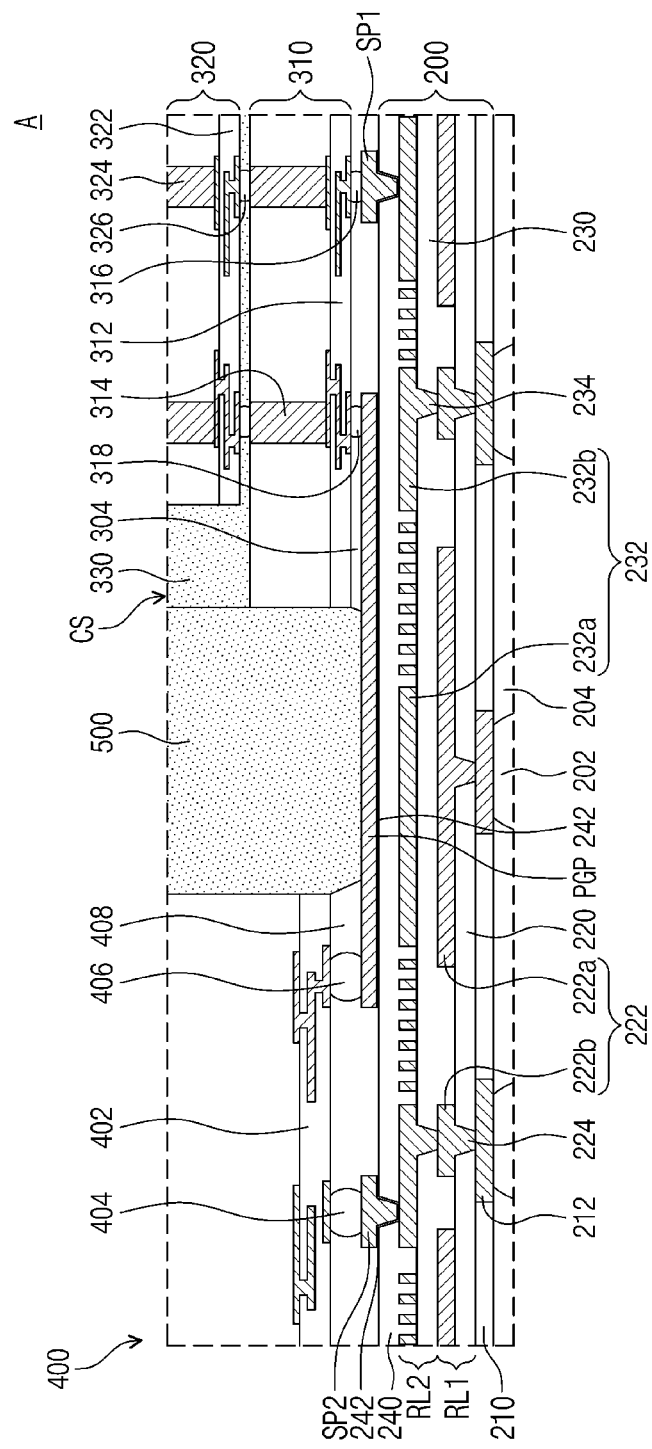
FIGS. 2 and 3 are enlarged views of section A depicted in FIG. 1, showing an interposer of a semiconductor package according to some embodiments of the present inventive concept.
Figure 3:
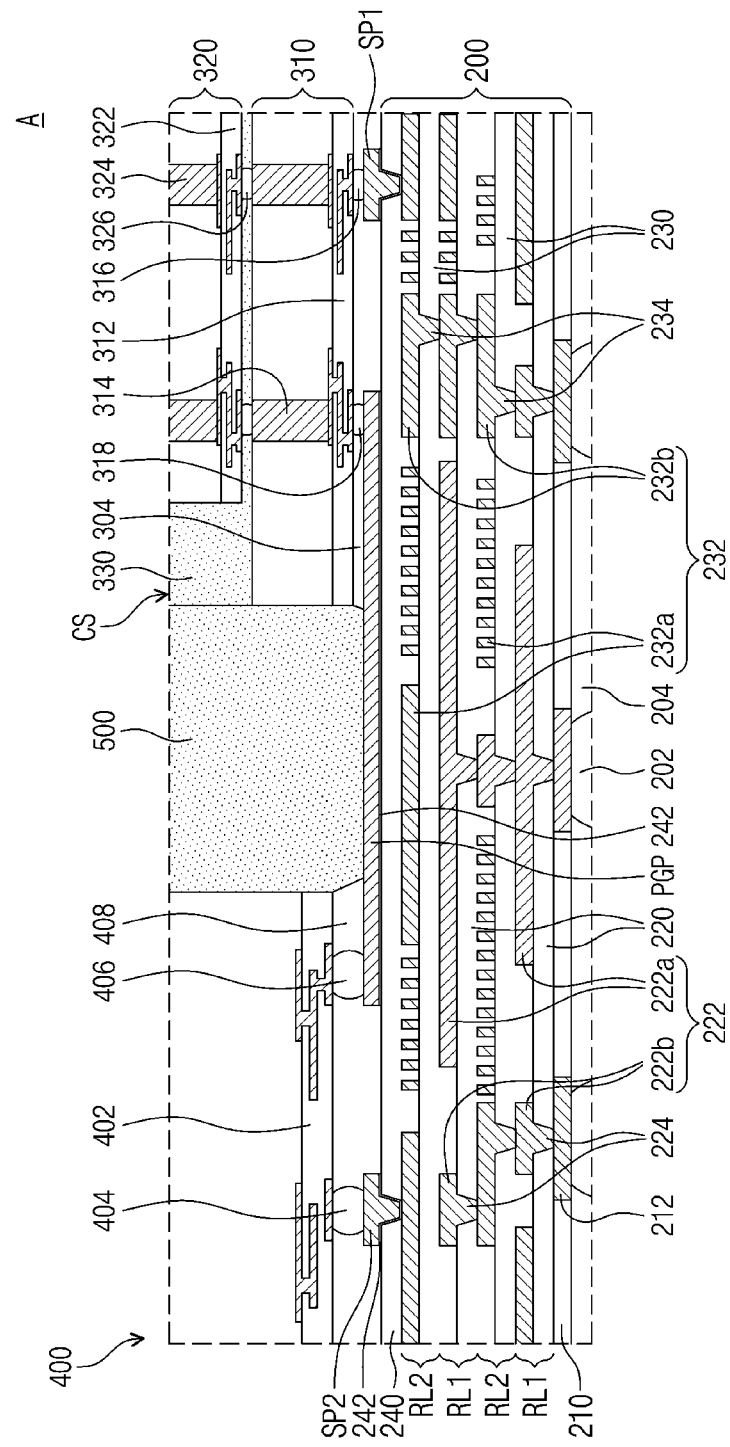
Figure 4:
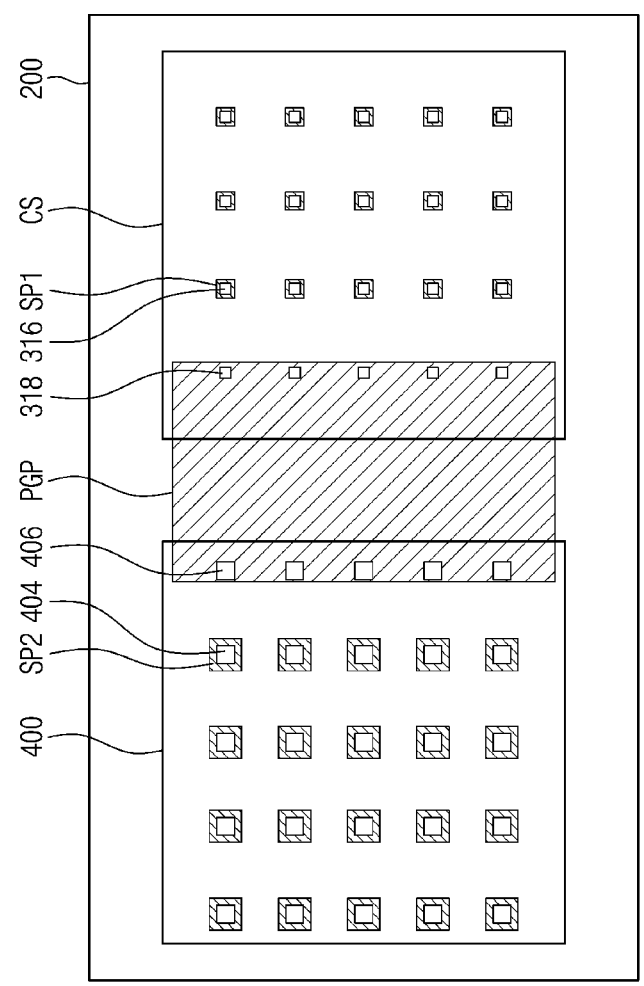
FIGS. 4, 5 and 6 are plan views showing a semiconductor package according to some embodiments of the present inventive concept.
Figure 5:
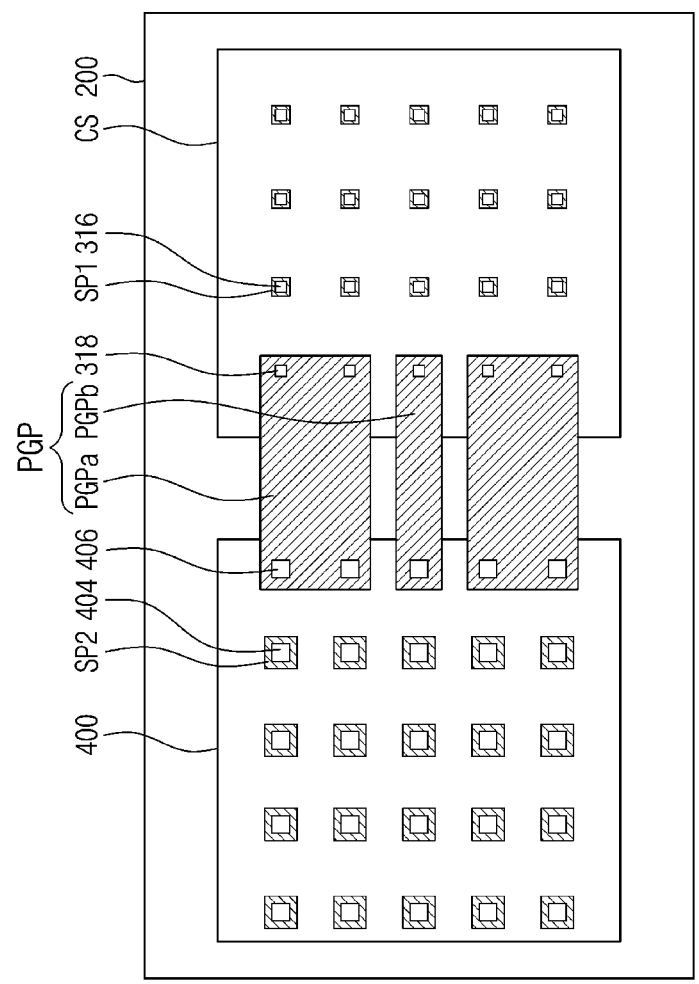
Figure 6:
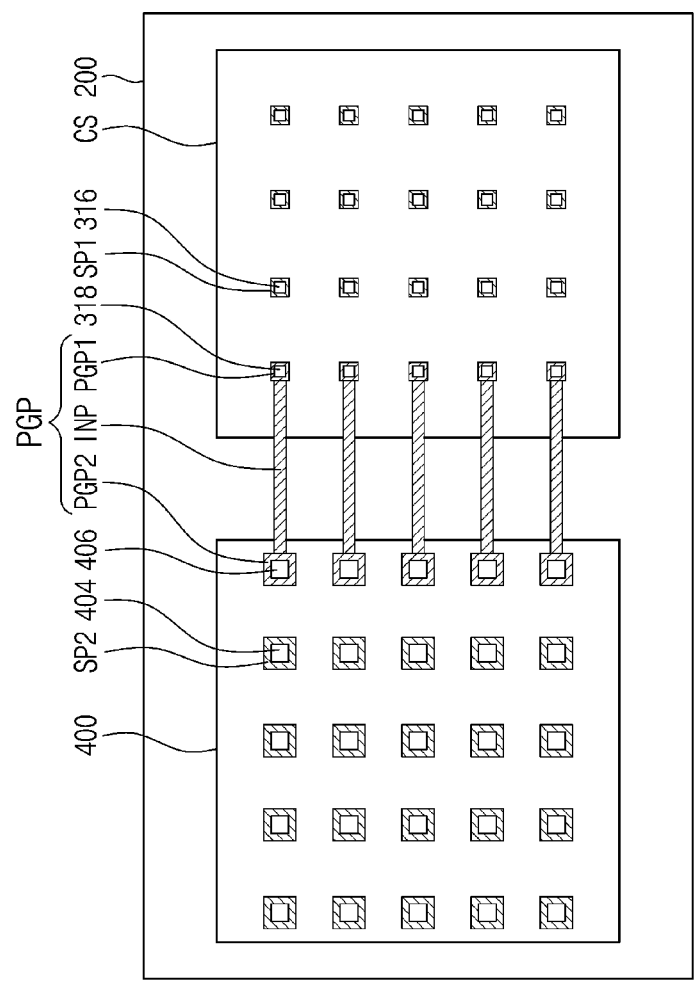

FIG. 1 is a cross-sectional view showing a semiconductor package according to some embodiments of the present inventive concept. FIGS. 2 and 3 are enlarged views of section A depicted in FIG. 1, showing an interposer of a semiconductor package according to some embodiments of the present inventive concept. FIGS. 4 to 6 are plan views showing a semiconductor package according to some embodiments of the present inventive concept.

Referring to FIG. 1, a package substrate 100 may be provided. The package substrate 100 may include a printed circuit board (PCB) having a signal pattern on a top surface thereof. Alternatively, the package substrate 100 may have a structure in which at least one dielectric layer and at least one wiring layer are alternately stacked. The package substrate 100 may have pads disposed on a top surface thereof. For example, the package substrate 100 may have pads disposed on a first surface thereof.

A plurality of external terminals 102 may be disposed below the package substrate 100. For example, the external terminals 102 may be disposed on terminal pads provided on a bottom surface of the package substrate 100. In other words, the external terminals 102 may be disposed on terminal pads provided on a second surface of the package substrate 100. The external terminals 102 may include solder balls or solder bumps, and based on type of the external terminals 102, a semiconductor package may be provided in the shape of one of a ball grid array (BGA) type, a fine ball-grid array (FBGA) type, and a land grid array (LGA) type.

An interposer 200 may be provided on the package substrate 100. The interposer 200 may include a first dielectric layer 210 and at least two wiring layers RL1 and RL2. The following will describe in detail a configuration of the interposer 200.

Referring to FIGS. 1 and 2, the first dielectric layer 210 may include a dielectric material. For example, the first dielectric layer 210 may include a dielectric polymer or a photo-imagable dielectric. The first dielectric layer 210 may have first substrate pads 212 electrically connected to the wiring layers RL1 and RL2 on the upper portion of the first dielectric layer 210. The first substrate pads 212 may be buried in the first dielectric layer 210. The first substrate pads 212 may be top and bottom surfaces of the first dielectric layer 210. In other words, the first substrate pads 212 may extend between top and bottom surfaces of the first dielectric layer 210. The first substrate pads 212 may have a seed or barrier layer that covers bottom and lateral surfaces of the first substrate pads 212. Alternatively, the seed or barrier layer may be provided only on the bottom surfaces of the first substrate pads 212.

A protection layer may be provided on the bottom surface of the first dielectric layer 210. The protection layer may cover the bottom surface of the first dielectric layer 210 and expose the first substrate pads 212.

A first wiring layer RL1 may be disposed on the first dielectric layer 210. The first wiring layer RL1 may be a power wiring line or a ground wiring line. The first wiring layer RL1 may include a first dielectric pattern 220 and a first wiring pattern 222.

The first dielectric pattern 220 may cover the first dielectric layer 210. The first dielectric pattern 220 may include a photo-imagable dielectric (PID). For example, the photo-imagable dielectric may include at least one selected from photosensitive polyimide, polybenzoxazole (PBO), phenolic polymers, and benzocyclobutene polymers. Alternatively, the first dielectric pattern 220 may include a dielectric polymer.

The first wiring pattern 222 may be provided on the first dielectric pattern 220. The first wiring pattern 222 may horizontally extend on the first dielectric pattern 220. For example, the first wiring pattern 222 may be first wiring parts 222a or first pad parts 222b of the first wiring layer RL1. For example, the first wiring pattern 222 may be a component for horizontal redistribution in the interposer 200. The first wiring part 222a of the first wiring pattern 222 may be a power/ground pattern (designated by the same reference numeral as that of the first wiring part 222a) for proving a power or ground to a chip stack CS or a second semiconductor chip 400 which will discussed below. The first wiring pattern 222 may be provided on a top surface of the first dielectric pattern 220. Different from that shown, the first wiring pattern 222 may be provided on an upper portion of the first dielectric pattern 220. In other words, the first wiring pattern 222 may be provided in or form the upper portion of the first dielectric pattern 220. In this case, a top surface of the first wiring pattern 222 may be exposed on the top surface of the first dielectric pattern 220. The first wiring pattern 222 may include a conductive material. For example, the first wiring pattern 222 may include copper (Cu).

First vias 224 may be provided below the first wiring pattern 222. The first vias 224 may be a component for connecting the first wiring pattern 222 of the first wiring layer RL1 to the first substrate pads 212. For example, the first vias 224 may be portions of the first wiring pattern 222, for example, the first vias 224 may be provided on a bottom surface of the first pad parts 222b of the first wiring pattern 222. The first vias 224 may have their bottom surfaces exposed on a bottom surface of the first dielectric pattern 220. The first vias 224 may extend from the first pad parts 222b of the first wiring pattern 222 to be coupled to top surfaces of the first substrate pads 212. Alternatively, portions of the first vias 224 may be components for connecting the first substrate pads 212 to a second wiring layer RL2 which will be discussed below. The first vias 224 may include a conductive material. For example, the first vias 224 may include copper (Cu).

The first wiring pattern 222 and the first vias 224 may each have a damascene structure. For example, the first pad part 222*b* and the first via 224 may be connected into a single unitary piece, and the first pad part 222*b* may be a head part and the first via 224 may be a tail part. The first pad part 222*b* and the first via 224 may have no interface therebetween. The first pad part 222*b* connected to the first via 224 may have a width greater than that of the first via 224. A combination of the first pad part 222*b* and the first via 224 may have a T-like shape.

A barrier or seed layer may be interposed between the first dielectric pattern 220 and the first wiring pattern 222. The barrier or seed layer may conformally cover lateral surfaces of the first wiring pattern 222 and the first via 224. For example, the barrier or seed layer may surround the first wiring pattern 222 and the first vias 224. The barrier layer may include titanium (Ti), tantalum (Ta), titanium nitride (TiN), or tantalum nitride (TaN).

A second wiring layer RL2 may be stacked on the first wiring layer RL1. The second wiring layer RL2 may be an input/output line connected to the chip stack CS and the second semiconductor chip 400 which will be discussed below. The second wiring layer RL2 may include a second dielectric pattern 230 and a second wiring pattern 232.

The second dielectric pattern 230 covers the first wiring pattern 222. The second dielectric pattern 230 may include a photo-imagable dielectric (PID). For example, the photo-imagable dielectric may include at least one selected from photosensitive polyimide, polybenzoxazole (PBO), phenolic polymers, and benzocyclobutene polymers. Alternatively, the second dielectric pattern 230 may include a dielectric polymer.

The second wiring pattern 232 may be provided on the second dielectric pattern 230. The second wiring pattern 232 may horizontally extend on the second dielectric pattern 230. For example, the second wiring pattern 232 may be a second wiring part 232*a* or a second pad part 232*b* of the second wiring layer RL2. For example, the second wiring pattern 232 may be a component for horizontal redistribution in the interposer 200. The second wiring part 232*a* of the second wiring pattern 232 may be a signal pattern (designated by the same reference numeral as that of the second wiring part 232*a*) for providing an input/output signal to the chip stack CS and the second semiconductor chip 400 which will be discussed below. The second wiring pattern 232 may be provided on a top surface of the second dielectric pattern 230. Different from that shown, the second wiring pattern 232 may be provided on an upper portion of the second dielectric pattern 230. In other words, the second wiring pattern 232 may be provided in or form the upper portion of the second dielectric pattern 230. In this case, a top surface of the second wiring pattern 232 may be exposed on the top surface of the second dielectric pattern 230. The second wiring pattern 232 may include a conductive material. For example, the second wiring pattern 232 may include copper (Cu).

Second vias 234 may be provided below the second wiring pattern 232. The second vias 234 may be a component for connecting the second wiring pattern 232 of the second wiring layer RL2 to the first wiring pattern 222 of the first wiring layer RL1. For example, the second vias 234 may portions of the second wiring pattern 232, for example, the second vias 234 may be provided on a bottom surface of the second pad part 232*b* of the second wiring pattern 232. The second vias 234 may extend from the second pad parts 232*b* of the second wiring pattern 232 to be coupled to the first wiring pattern 222, for example, to a top surface of the first pad part 222*b* of the first wiring pattern 222. The second wiring pattern 232 may be connected to the first substrate pads 212 through some of the first and second vias 224 and 234. The second vias 234 may include a conductive material. For example, the second vias 234 may include copper (Cu).

The second wiring pattern 232 and the second vias 234 may each have a damascene structure. For example, the second pad part 232*b* and the second via 234 may be connected into a single unitary piece, and the second pad part 232*b* may be a head part and the second via 234 may be a tail part. The second pad part 232*b* and the second via 234 may have no interface therebetween. The second pad part 232*b* connected to the second via 234 may have a width greater than that of the second via 234. A combination of the second pad part 232*b* and the second via 234 may have a T-like shape.

A barrier or seed layer may be interposed between the second dielectric pattern 230 and the second wiring pattern 232. The barrier or seed layer may conformally cover lateral surfaces of the second wiring pattern 232 and the second via 234. For example, the barrier or seed layer may surround the second wiring pattern 232 and the second vias 234. The barrier layer may include titanium (Ti), tantalum (Ta), titanium nitride (TiN), or tantalum nitride (TaN).

The first wiring pattern 222 of the first wiring layer RL1 or the second wiring pattern 232 of the second wiring layers RL2 may have a shape or a wiring layout that is changed as needed. The signal pattern 232*a* of the second wiring pattern 232 may vertically overlap the power/ground pattern 222*a* of the first wiring pattern 222. The power/ground pattern 222*a* disposed adjacent to the signal pattern 232*a* may serve as a return path of the signal pattern 232*a*. For example, the power/ground pattern 222*a* may shield electromagnetic waves that are generated from or introduced into the signal pattern 232*a*, and thus may reduce crosstalk to or from the signal pattern 232*a*. In other words, the power/ground pattern 222*a* may be a shield pattern. As a result, a semiconductor package may have improved electrical properties.

A second dielectric layer 240 may be provided on the second wiring layer RL2. The second dielectric layer 240 may cover the second dielectric pattern 230 of the second wiring layer RL2. The second dielectric layer 240 may include a photo-imagable dielectric (PID). For example, the photo-imagable dielectric may include at least one selected from photosensitive polyimide, polybenzoxazole (PBO), phenolic polymers, and benzocyclobutene polymers. Alternatively, the second dielectric layer 240 may include a dielectric polymer.

The second dielectric layer 240 may be provided with second substrate pads SP1, SP2, and PGP thereon. The second substrate pads SP1, SP2, and PGP may correspond to patterns exposed on a top surface of the interposer 200. The second substrate pads SP1, SP2, and PGP may protrude onto a top surface of the second dielectric layer 240. For example, the second substrate pads SP1, SP2, and PGP may each have a T-shaped cross section. The second substrate pads SP1, SP2, and PGP may each have a head part that is provided on the top surface of the second dielectric layer 240, and may also have a tail part that penetrates the second dielectric layer 240 to be coupled to the second wiring pattern 232 of the second wiring layer RL2. The head parts, which are positioned on the second dielectric layer 240, of the second substrate pads SP1, SP2, and PGP may be pad parts of the interposer 200 for mounting of the chip stack CS and the second semiconductor chip 400. For example, first signal pads SP1 may be pads for mounting of the chip stack CS, and second signal pads SP2 may be pads for mounting of the second semiconductor chip 400. The first signal pads SP1 may be positioned below the chip stack CS, and the second signal pads SP2 may be positioned below the second semiconductor chip 400. The first signal pads SP1 and the second signal pads SP2 may be electrically connected to the signal pattern 232a of the second wiring layer RL2. A power/ground pad PGP may be positioned between the first signal pads SP1 and the second signal pads SP2. For example, when viewed in a plan view, the power/ground pad PGP may be positioned between the chip stack CS and the second semiconductor chip 400. The power/ground pad PGP may be electrically connected to the power/ground pattern 222a of the first wiring layer RL1. An interconnection relationship between the chip stack CS, the second semiconductor chip 400, the first and second signal pads SP1 and SP2, and the power/ground pad PGP will be discussed in detail below in describing the chip stack CS and the second semiconductor chip 400. The second substrate pads SP1, SP2, and PGP may include a conductive material. For example, the second substrate pads SP1, SP2, and PGP may include copper (Cu).

A seed/barrier layer 242 may be interposed between the second dielectric layer 240 and the second substrate pads SP1, SP2, and PGP. The seed/barrier layer 242 may conformally cover bottom surfaces or lateral surfaces of the second substrate pads SP1, SP2, and PGP. For example, the seed/barrier layer 242 may surround the second substrate pads SP1, SP2, and PGP. The seed/barrier layer 242 may include titanium (Ti), tantalum (Ta), titanium nitride (TiN), or tantalum nitride (TaN).

FIG. 2 depicts that there are provided one first wiring layer RL1 and one second wiring layer RL2, but the present inventive concept is not limited thereto. The first wiring layer RL1 and the second wiring layer RL2 may each be provided in plural. Referring to FIG. 3, the first wiring layers RL1 may be stacked alternately with the second wiring layers RL2. For example, one of the first wiring layers RL1 may be stacked on the first dielectric layer 210, one of the second wiring layers RL2 may be stacked the one first wiring layer RL1, another of the first wiring layers RL1 may be stacked on the one second wiring layer RL2, and another of the second wiring layers RL2 may be stacked on the another first wiring layer RL1. In a stack structure of the first wiring layers RL1 and the second wiring layers RL2, one of the first wiring layers RL1 may be disposed at a bottom end of the structure, and one of the second wiring layers RL2 may be disposed at a top end of the structure.

A configuration of the first wiring layers RL1 and a configuration of the second wiring layers RL2 may be substantially the same as that discussed with reference to FIG. 2. The first signal pads SP1 and the second signal pads SP2 may be electrically connected to the signal patterns 232a of the second wiring layers RL2. The power/ground pad PGP may be electrically connected to the power/ground patterns 222a of the first wiring layers RL1.

The first wiring pattern 222 of the first wiring layers RL1 or the second wiring pattern 232 of the second wiring layers RL2 may have a shape or a wiring layout that is changed as needed. The signal patterns 232a of the second wiring patterns 232 may vertically overlap the power/ground patterns 222a of the first wiring patterns 222. The power/ground patterns 222a disposed adjacent to the signal patterns 232a may serve as return paths of the signal patterns 232a.

For example, the second wiring layer RL2 disposed between the first wiring layers RL1 may be configured such that the power/ground patterns 222a may be disposed above and below the signal patterns 232a, and that crosstalk to or from the signal patterns 232a may be effectively reduced. As a result, there may be provided a semiconductor package whose electrical properties are improved. The following description will focus on the embodiment of FIG. 2.

Referring back to FIG. 1, the interposer 200 may be mounted on the top surface of the package substrate 100. The interposer 200 may be provided with substrate terminals 202 on a bottom surface thereof. The substrate terminals 202 may be provided between the first substrate pads 212 of the interposer 200 and the pads of the package substrate 100. The substrate terminals 202 may electrically connect the interposer 200 to the package substrate 100. For example, the interposer 200 may be flip-chip mounted on the package substrate 100. The substrate terminals 202 may include solder balls or solder bumps.

A first under-fill layer 204 may be provided between the package substrate 100 and the interposer 200. The first under-fill layer 204 may fill a space between the package substrate 100 and the interposer 200 and may surround the substrate terminals 202.

The chip stack CS may be disposed on the interposer 200. The chip stack CS may include a base substrate, first semiconductor chips 320 stacked on the base substrate, and a first molding layer 330 that surrounds the first semiconductor chips 320. The following will describe in detail a configuration of the chip stack CS.

The base substrate may be a base semiconductor chip 310. For example, the base substrate may be a wafer-level semiconductor substrate formed of a semiconductor material such as silicon (Si). In this description below, the base semiconductor chip 310 and the base substrate may indicate the same component and may be allocated with the same reference numeral.

The base semiconductor chip 310 may include a base circuit layer 312 and base through electrodes 314. The base circuit layer 312 may be provided on a bottom surface of the base semiconductor chip 310. The base circuit layer 312 may include an integrated circuit. For example, the base circuit layer 312 may be a memory circuit. For example, the base semiconductor chip 310 may be a memory chip, such as dynamic random-access memory (DRAM), static random-access memory (SRAM), magnetic random-access memory (MRAM), or Flash memory. The base through electrodes 314 may penetrate the base semiconductor chip 310 in a direction perpendicular to the top surface of the interposer 200. The base through electrodes 314 may be electrically connected to the base circuit layer 312. The bottom surface of the base semiconductor chip 310 may be an active surface. FIG. 1 depicts that the base substrate includes the base semiconductor chip 310, but the present inventive concept is not limited thereto. According to some embodiments of the present inventive concept, the base substrate may not include the base semiconductor chip 310.

The base semiconductor chip 310 may further include a protection layer, first connection terminals 316, and second connection terminals 318. The protection layer may be disposed on the bottom surface of the base semiconductor chip 310, thereby covering the base circuit layer 312. The protection layer may include silicon nitride (SiN). The first connection terminals 316 may be provided on the bottom surface of the base semiconductor chip 310. The first connection terminals 316 may be electrically connected to an input/output circuit (e.g., a memory circuit) of the base circuit layer 312. The second connection terminals 318 may be electrically connected to a power circuit or a ground circuit of the base circuit layer 312. The first connection terminals 316 and the second connection terminals 318 may be exposed by the protection layer.

The first semiconductor chip 320 may be mounted on the base semiconductor chip 310. For example, the first semiconductor chip 320 and the base semiconductor chip 310 may constitute a chip-on-wafer (COW) structure. The first semiconductor chip 320 may have a width less than that of the base semiconductor chip 310.

The first semiconductor chip 320 may include a first circuit layer 322 and first through electrodes 324. The first circuit layer 322 may include a memory circuit. The first semiconductor chip 320 may be a memory chip, such as dynamic random-access memory (DRAM), static random-access memory (SRAM), magnetic random-access memory (MRAM), or Flash memory. The first circuit layer 322 may include the same circuit as that of the base circuit layer 312, but the present inventive concept is not limited thereto. The first through electrodes 324 may penetrate the first semiconductor chip 320 in a direction perpendicular to the top surface of the interposer 200. The first through electrodes 324 may be electrically connected to the first circuit layer 322. The first semiconductor chip 320 may have a bottom surface or an active surface. The first semiconductor chip 320 may be provided with first chip bumps 326 on the bottom surface thereof. The first chip bumps 326 may be provided between the base semiconductor chip 310 and the first semiconductor chip 320, which are electrically connected to each other through the first chip bumps 326.

The first semiconductor chip 320 may be provided in plural. For example, a plurality of first semiconductor chips 320 may be stacked on the base semiconductor chip 310. The number of stacked first semiconductor chips 320 may be about 8 to about 21. However, the present inventive concept is not limited thereto and less than 8 or more than 21 stacked first semiconductor chips 320 may be provided on the base semiconductor chip 310. The first chip bumps 326 may be correspondingly provided between the first semiconductor chips 320. In this case, an uppermost first semiconductor chip 320 may not include the first through electrodes 324. In addition, the uppermost first semiconductor chip 320 may have a thickness greater than those of other first semiconductor chips 320 that underlie the uppermost first semiconductor chip 320.

An adhesion layer may be provided between the first semiconductor chips 320. The adhesion layer may include a non-conductive film (NCF). The adhesion layer may be interposed between the first chip bumps 326 between the first semiconductor chips 320, thereby preventing the occurrence of an electrical short between the first chip bumps 326.

The first molding layer 330 may be disposed on a top surface of the base semiconductor chip 310. The first molding layer 330 may cover the base semiconductor chip 310 and surround the first semiconductor chips 320. The first molding layer 330 may have a top surface coplanar with that of the uppermost first semiconductor chip 320, and the uppermost first semiconductor chip 320 may be exposed from the first molding layer 330. The first molding layer 330 may include a dielectric polymer material. For example, the first molding layer 330 may include an epoxy molding compound (EMC).

As such, the chip stack CS may be provided. The chip stack CS may be mounted on the interposer 200. For example, the chip stack CS may be coupled through the first connection terminals 316 of the base semiconductor chip 310 to the first signal pads SP1 of the interposer 200. The first connection terminals 316 may be provided between the base circuit layer 312 and the first signal pads SP1 of the interposer 200.

A second under-fill layer 304 may be provided between the interposer 200 and the chip stack CS. The second under-fill layer 304 may fill a space between the interposer 200 and the base semiconductor chip 310, and may surround the first connection terminals 316 and the second connection terminals 318.

The second semiconductor chip 400 may be disposed on the interposer 200. The second semiconductor chip 400 may be spaced apart from the chip stack CS. An interval between the second semiconductor chip 400 and the chip stack CS may range from about 50 µm to about 100 µm. The second semiconductor chip 400 may have a thickness greater than those of the first semiconductor chips 320. The second semiconductor chip 400 may include a semiconductor material, such as silicon (Si). The second semiconductor chip 400 may include a second circuit layer 402. The second circuit layer 402 may include a logic circuit. For example, the second semiconductor chip 400 may be a logic chip. A bottom surface of the second semiconductor chip 400 may be an active surface, and a top surface of the second semiconductor chip 400 may be an inactive surface. The second semiconductor chip 400 may include third connection terminals 404 and fourth connection terminals 406 on its bottom surface. The third connection terminals 404 may be electrically connected to an input/output circuit (e.g., a logic circuit) of the second circuit layer 402. The fourth connection terminals 406 may be electrically connected to a power circuit or a ground circuit of the second circuit layer 402.

The second semiconductor chip 400 may be mounted on the interposer 200. For example, the second semiconductor chip 400 may be coupled through the third connection terminals 404 to the second signal pads SP2 of the interposer 200. The third connection terminals 404 may be provided between the second circuit layer 402 and the second signal pads SP2 of the interposer 200.

A third under-fill layer 408 may be provided between the interposer 200 and the second semiconductor chip 400. The third under-fill layer 408 may fill a space between the interposer 200 and the second semiconductor chip 400, and may surround the third connection terminals 404 and the fourth connection terminals 406.

The chip stack CS and the second semiconductor chip 400 may receive input signals from outside or may send output signals to outside through the first connection terminals 316, the third connection terminals 404, the first signal pads SP1 connected to the first connection terminals 316, and the second signal pads SP2 connected to the third connection terminals 404. In addition, the chip stack CS and the second semiconductor chip 400 may be grounded through the interposer 200 or may receive a power voltage through the interposer 200. For example, the chip stack CS may be coupled through the second connection terminals 318 of the base semiconductor chip 310 to the power/ground pad PGP of the interposer 200, and the second semiconductor chip 400 may be coupled through the fourth connection terminals 406 to the power/ground pad PGP of the interposer 200. In this case, the second connection terminals 318 of the chip stack CS and the second semiconductor chip 400 may be simultaneously coupled to one power/ground pad PGP, and the power/ground pad PGP may be a common power/ground pad for the chip stack CS and the second semiconductor chip 400.

Referring to FIGS. 1 and 4, when viewed in a plan view, the power/ground pad PGP may overlap a portion of the chip stack CS and a portion of the second semiconductor chip 400. For example, the power/ground pad PGP may extend from a region between the chip stack CS and the second semiconductor chip 400 toward a location below the chip stack CS and also toward a location below the second semiconductor chip 400. The second connection terminals 318 may be interposed between the chip stack CS and the power/ground pad PGP. To achieve the configuration mentioned above, the second connection terminals 318 may be disposed adjacent to a lateral surface of the chip stack CS, wherein the lateral surface is directed toward the second semiconductor chip 400. In other words, the second connection terminals 318 may be adjacent to an edge of the chip stack CS. The fourth connection terminals 406 may be interposed between the second semiconductor chip 400 and the power/ground pad PGP. To achieve the configuration mentioned above, the fourth connection terminals 406 may be disposed adjacent to a lateral surface of the second semiconductor chip 400, wherein the lateral surface is directed toward the chip stack CS. In other words, the fourth connection terminals 406 may be adjacent to an edge of the second semiconductor chip 400. The power/ground pad PGP may have a plate shape that is provided as a unitary piece that covers a region between the chip stack CS and the second semiconductor chip 400.

According to some embodiments of the present inventive concept, because the chip stack CS and the second semiconductor chip 400 are simultaneously connected to one power/ground pad PGP, it is possible to simplify ground and/or power lines (e.g., the power/ground pattern 222a of the first wiring layer RL1) in the interposer 200. For example, the power/ground pattern 222a in the interposer 200 may be achieved by redistribution of only one power/ground pad PGP, and thus, a wiring layout of the power/ground pattern 222a may be simplified. For example, the power/ground pattern 222a may have a small volume in the interposer 200, and thus, there may be provided a semiconductor package including the interposer 200 having a small size and a high degree of freedom of wiring design.

Referring to FIGS. 1, 2, and 4, the power/ground pad PGP may vertically overlap the signal pattern 232a of the interposer 200. For example, the chip stack CS and the second semiconductor chip 400 may be connected to each other through the interposer 200, and at least a portion of the signal pattern 232a of the interposer 200 may extend toward the second semiconductor chip 400 from a location below the chip stack CS. Since the power/ground pad PGP has a plate shape that covers a space between the chip stack CS and the second semiconductor chip 400, the power/ground pad PGP may be positioned above and vertically overlap the signal pattern 232a.

According to some embodiments of the present inventive concept, when viewed in a cross-section view, the signal pattern 232a may be positioned between the power/ground pad PGP and the power/ground pattern 222a of the first wiring layer RL1. The power/ground pad PGP and the power/ground pattern 222a adjacent to the signal pattern 232a may serve as a return path of the signal pattern 232a. For example, not only the power/ground pattern 222a in the interposer 200 but also the power/ground pad PGP on the top surface of the interposer 200 may serve as a return path, and the return path may effectively shield electromagnetic waves generated from or introduced into the signal pattern 232a to significantly reduce crosstalk to or from the signal pattern 232a. As a result, there may be provided a semiconductor package whose electrical properties are improved.

FIG. 4 depicts that one power/ground path PGP to which the second connection terminals 318 of the chip stack CS are coupled and the fourth connection terminals 406 of the second semiconductor chip 400 are coupled, but the present inventive concept is not limited thereto. As shown in FIG. 5, the power/ground pad PGP may be provided in plural. Each of power/ground pads PGPa may be provided to which are coupled at least two second connection terminals 318 and at least two fourth connection terminals 406. Additionally, or alternatively, each of power/ground pads PGPb may be provided to which are coupled a single second connection terminal 318 and a single fourth connection terminal 406. Each of the power/ground pads PGP may vertically overlap the signal pattern 232a of the second wiring layer RL2 in the interposer 200.

FIG. 4 depicts that one power/ground pad PGP is provided in the shape of a plate, but the present inventive concept is not limited thereto. As shown in FIG. 6, the power/ground pad PGP may include first power/ground pads PGP1, second power/ground pads PGP2, and a connection pattern INP. In the description below, the first power/ground pad PGP1, the second power/ground pad PGP2, and the connection pattern INP may constitute a single unitary pad formed of one constituent material, and are not limited to separate components based on their names. For example, the first power/ground pad PGP1, the second power/ground pad PGP2, and the connection pattern INP may be called a pad or a pattern depending on shape and function thereof. The first power/ground pads PGP1 may be pads to which are coupled the second connection terminals 318 of the chip stack CS. The first power/ground pads PGP1 may be disposed below the chip stack CS. The first power/ground pads PGP1 may be disposed adjacent to a lateral surface of the chip stack CS, wherein the lateral surface is directed toward the second semiconductor chip 400. In other words, the lateral surface of the chip stack CS is the closest lateral surface of the chip stack CS to the second semiconductor chip 400. The second power/ground pads PGP2 may be pads to which are coupled the fourth connection terminals 406 of the second semiconductor chip 400. The second power/ground pads PGP2 may be disposed below the second semiconductor chip 400. The second power/ground pads PGP2 may be disposed adjacent to a lateral surface of the second semiconductor chip 400, wherein lateral surface is directed toward the chip stack CS. In other words, the lateral surface of the second semiconductor chip 400 is the closest lateral surface of the second semiconductor chip 400 to the chip stack CS. The connection pattern INP may connect the first power/ground pads PGP1 to the second power/ground pads PGP2. As shown in FIG. 6, the connection pattern INP may have linear shape that connects one first power/ground pad PGP1 to one second power/ground pad PGP2. Alternatively, the connection pattern INP may have a linear, curved, or plate shape that connects at least one first power/ground pad PGP1 to at least one second power/ground pad PGP2. When viewed in a plan view, the connection pattern INP may be disposed between the chip stack CS and the second semiconductor chip 400. The connection pattern INP may be positioned above and vertically overlap the signal pattern 232a. The connection pattern INP may serve as a return path of the signal pattern 232a. The following description will focus on the embodiment of FIG. 4.

Referring back to FIGS. 1 and 2, the power/ground pad PGP may be a component that is formed in the same process as that for forming the first signal pads SP1 and the second signal pads SP2. This will be discussed in detail together with a method of fabricating a semiconductor package. The power/ground pad PGP may have a top surface located at the same level as that of top surfaces of the first signal pads SP1 and that of top surfaces of the second signal pads SP2.

A second molding layer 500 may be provided on the interposer 200. The second molding layer 500 may cover the top surfaces of the interposer 200. The second molding layer 500 may surround the chip stack CS and the second semiconductor chip 400. The second molding layer 500 may include a dielectric material. For example, the second molding layer 500 may include an epoxy molding compound (EMC).

FIG. 6 depicts the power/ground pad PGP including the first power/ground pads PGP1, the second power/ground pads PGP2, and the connection pattern INP that connects the first and second power/ground pads PGP1 and PGP2 to each other, but the present inventive concept is not limited thereto.

Figure 7:
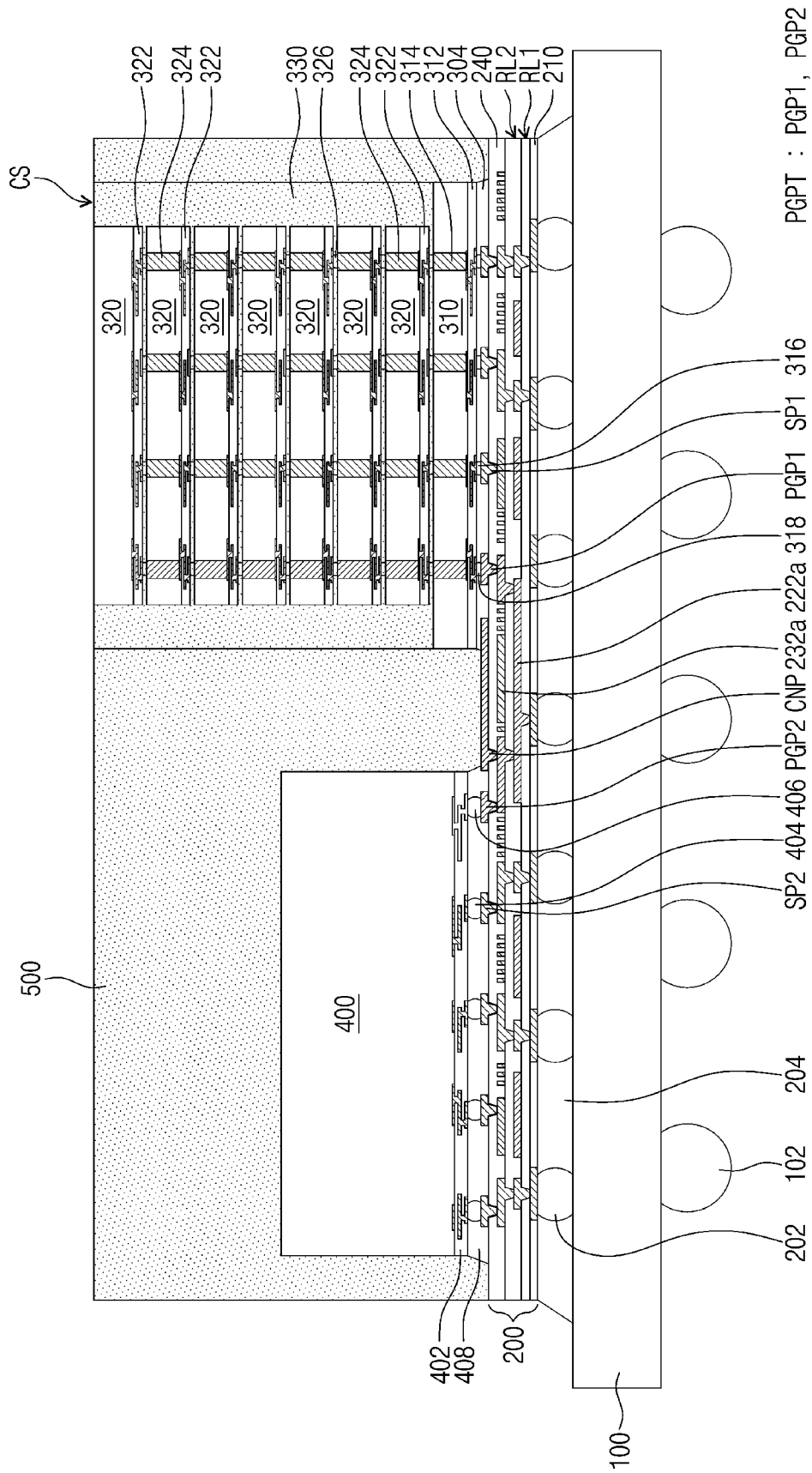
FIG. 7 is a cross-sectional view showing a semiconductor package according to some embodiments of the present inventive concept.
Figure 8:
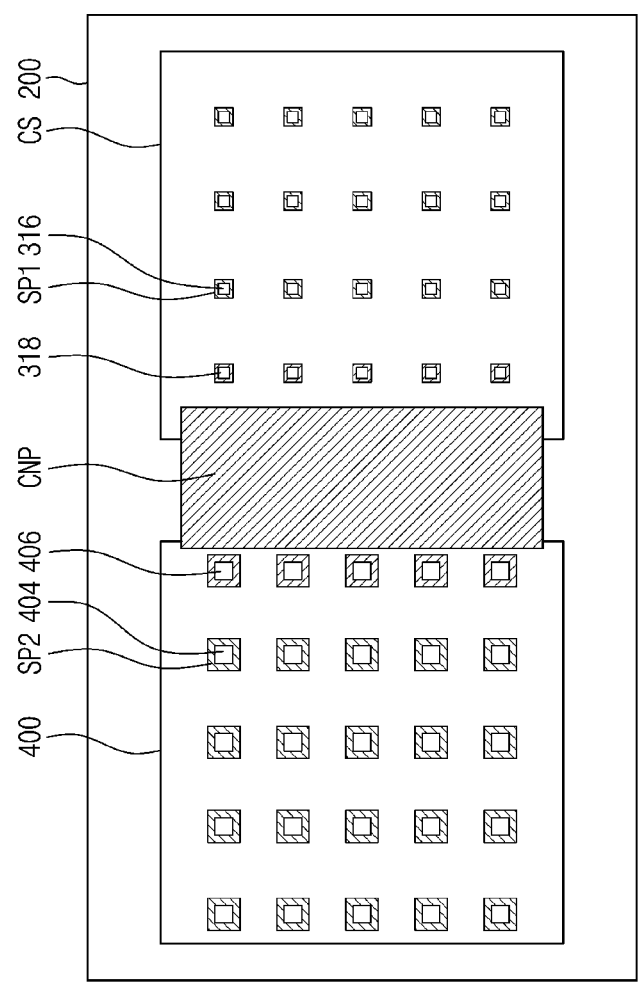
FIG. 8 is a plan view showing a semiconductor package according to some embodiments of the present inventive concept.

FIG. 7 is a cross-sectional view showing a semiconductor package according to some embodiments of the present inventive concept. FIG. 8 is a plan view showing a semiconductor package according to some embodiments of the present inventive concept. In the embodiments that follow, components the same as those discussed with reference to FIGS. 1 to 6 are allocated the same reference numerals, and thus, a repetitive explanation thereof will be omitted or abridged for convenience of description. The following description will focus on differences between the embodiments of FIGS. 1 to 6 and other embodiments described below.

Referring to FIGS. 7 and 8, a semiconductor package may have a power/ground pattern PGPT, instead of the power/ground pad PGP, which includes first power/ground pads PGP1, second power/ground pads PGP2, and an intermediate pattern CNP that are configured independently of each other. The first power/ground pads PGP1, the second power/ground pads PGP2, and the intermediate pattern CNP may be electrically connected to each other. For example, the chip stack CS and the second semiconductor chip 400 may be coupled to the same power circuit or the same ground circuit.

The power/ground pattern PGPT may be a component that is formed in the same process as that for forming the first signal pads SP1 and the second signal pads SP2. For example, the first power/ground pads PGP1, the second power/ground pads PGP2, and the intermediate pattern CNP may each be exposed on the top surface of the interposer 200. The first power/ground pads PGP1, the second power/ground pads PGP2, and the intermediate pattern CNP may protrude onto the top surface of the second dielectric layer 240. The first power/ground pads PGP1, the second power/ground pads PGP2, and the intermediate pattern CNP may have their top surfaces at the same level as that of the top surfaces of the first signal pads SP1 and that of the top surfaces of the second signal pads SP2.

The first power/ground pads PGP1 may be pads to which are coupled the second connection terminals 318 of the chip stack CS. The first power/ground pads PGP1 may be disposed below the chip stack CS. The first power/ground pads PGP1 may be adjacent to a lateral surface of the chip stack CS, wherein the lateral surface is directed toward the second semiconductor chip 400. The second power/ground pads PGP2 may be pads to which are coupled the fourth connection terminals 406 of the second semiconductor chip 400. The second power/ground pads PGP2 may be disposed below the second semiconductor chip 400. The second power/ground pads PGP2 may be adjacent to a lateral surface of the second semiconductor chip 400, wherein the lateral surface is directed toward the chip stack CS.

When viewed in a plan view, the intermediate pattern CNP may be disposed between the chip stack CS and the second semiconductor chip 400. The intermediate pattern CNP may be positioned between the first power/ground pads PGP1 and the second power/ground pads PGP2. The intermediate pattern CNP may be spaced apart from the first power/ground pads PGP1 and the second power/ground pads PGP2. The intermediate pattern CNP may be positioned above and vertically overlap the signal pattern 232a. The intermediate pattern CNP may serve as a return path of the signal pattern 232a.

As shown in FIG. 8, the intermediate pattern CNP may have a plate shape that is positioned between the first power/ground pads PGP1 and the second power/ground pads PGP2. For example, the intermediate pattern CNP is positioned between the fourth connection terminals 406 of the second semiconductor chip 400 and the second connection terminals 318 of the chip stack CS. Alternatively, the intermediate pattern CNP may have a linear shape that extends from the first power/ground pads PGP1 toward the second power/ground pads PGP2 or that runs across between the first power/ground pads PGP1 and the second power/ground pads PGP2. Alternatively, when the intermediate pattern CNP is directly connected to the first power/ground pads PGP1 and the second power/ground pads PGP2, the intermediate pattern CNP may correspond to the connection pattern (see INP of FIG. 6) discussed with reference to FIG. 6.

The intermediate pattern CNP may be electrically connected to the power/ground pattern 222a of the first wiring layer RL1. The intermediate pattern CNP may be coupled through the first wiring layer RL1 to a power circuit or a ground circuit, and may serve as a return path of the signal pattern 232a. The first power/ground pads PGP1, the second power/ground pads PGP2, and the intermediate pattern CNP may all be connected to the power/ground pattern 222a of the first wiring layer RL1, and the chip stack CS and the second semiconductor chip 400 may be coupled to the same power circuit or the same ground circuit.

Figure 9:
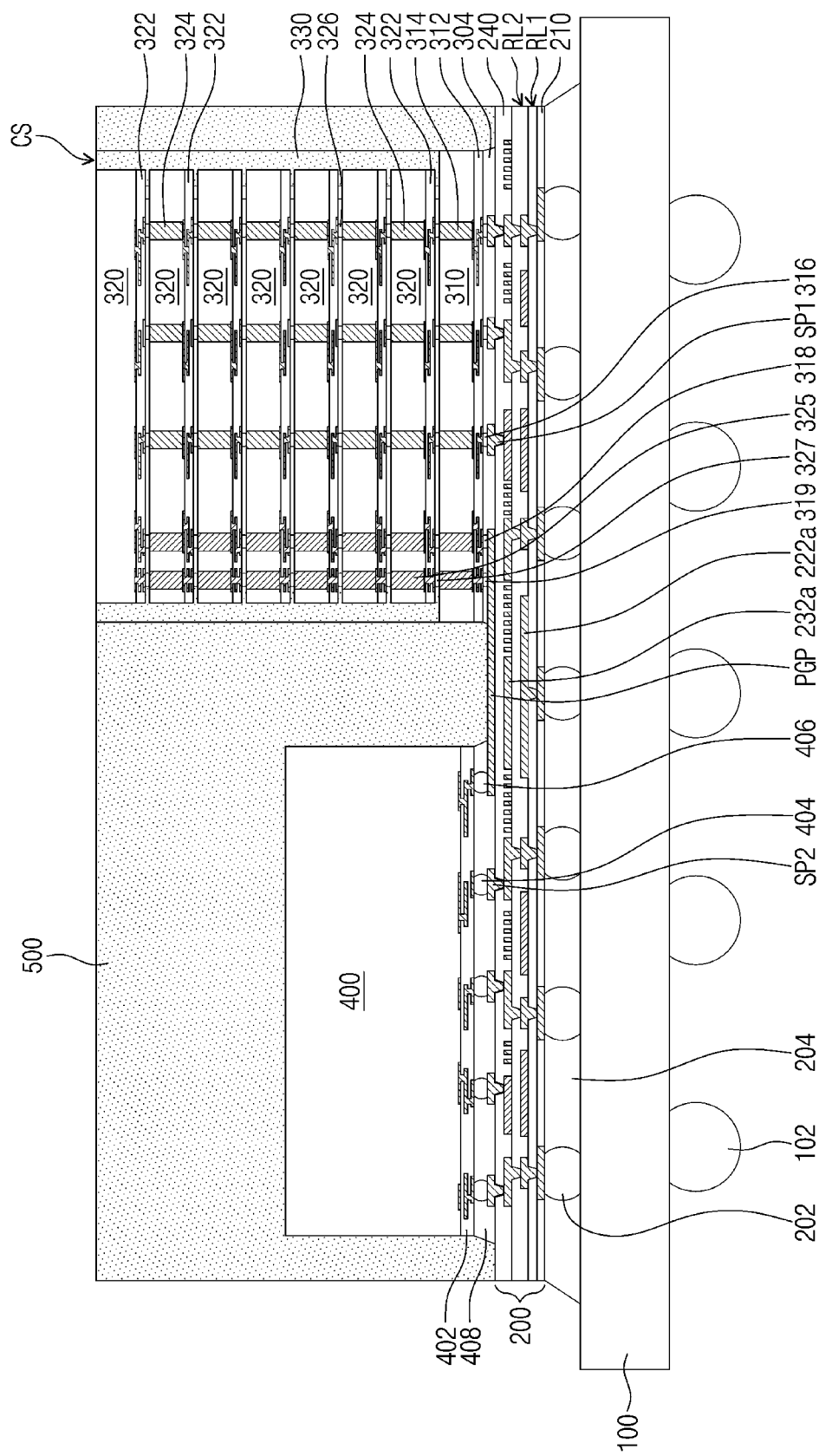
FIGS. 9 and 10 are cross-sectional views showing a semiconductor package according to some embodiments of the present inventive concept.

FIG. 9 is a cross-sectional view showing a semiconductor package according to some embodiments of the present inventive concept.

Referring to FIG. 9, the base semiconductor chip 310 may further include fifth connection terminals 319. The fifth connection terminals 319 may be provided on the bottom surface of the base semiconductor chip 310. The fifth connection terminals 319 may be disposed adjacent to a lateral surface of the base semiconductor chip 310, wherein the lateral surface of the base semiconductor chip 310 is close to the second semiconductor chip 400. The fifth connection terminals 319 may be electrically insulated from an input/output circuit (e.g., a memory circuit) of the base circuit layer 312. For example, the fifth connection terminals 319 may be dummy terminals. The fifth connection terminals 319 may be exposed from the protection layer. The fifth connection terminals 319 may be coupled to the power/ground pad PGP.

The first semiconductor chip 320 may further include second chip bumps 327. The second chip bumps 327 may be provided on the bottom surface of the first semiconductor chip 320. The first chip bumps 326 may be signal bumps for transceiving input/output signals, power signals, and ground signals between the first semiconductor chip 320 and the base semiconductor chip 310. The first chip bumps 326 may be disposed on central portions of the first semiconductor chips 320. The second chip bumps 327 may be dummy bumps that support the first semiconductor chip 320. The second chip bumps 327 may be electrically insulated from integrated circuits of the first semiconductor chips 320. The second chip bumps 327 may be disposed on outer portions of the first semiconductor chips 320, wherein the outer portions of the first semiconductor chips 320 surround the central portions of the first semiconductor chips 320. The first semiconductor chips 320 may be supported by the second chip bumps 327 on the outer portions of the first semiconductor chips 320, wherein the outer portions of the first semiconductor chips 320 do not include the first chip bumps 326. The second chip bumps 327 may be connected to the fifth connection terminals 319. For example, the second chip bumps 327 may be electrically connected to the power/ground pad PGP through the base through electrodes 314 and the fifth connection terminals 319.

The second chip bumps 327 may be vertically aligned with each other along the first semiconductor chips 320 that are vertically stacked. The second chip bumps 327 vertically stacked may be connected to each other by dummy through electrodes 325 that penetrate the first semiconductor chips 320. Since the second chip bumps 327 and the dummy through electrodes 325 are connected to the power/ground pad PGP, the second chip bumps 327 and the dummy through electrodes 325 may serve as electromagnetic shielding layers that protect the first semiconductor chips 320 from electromagnetic interference. Accordingly, there is provided a semiconductor package whose electrical properties are improved.

Figure 10:
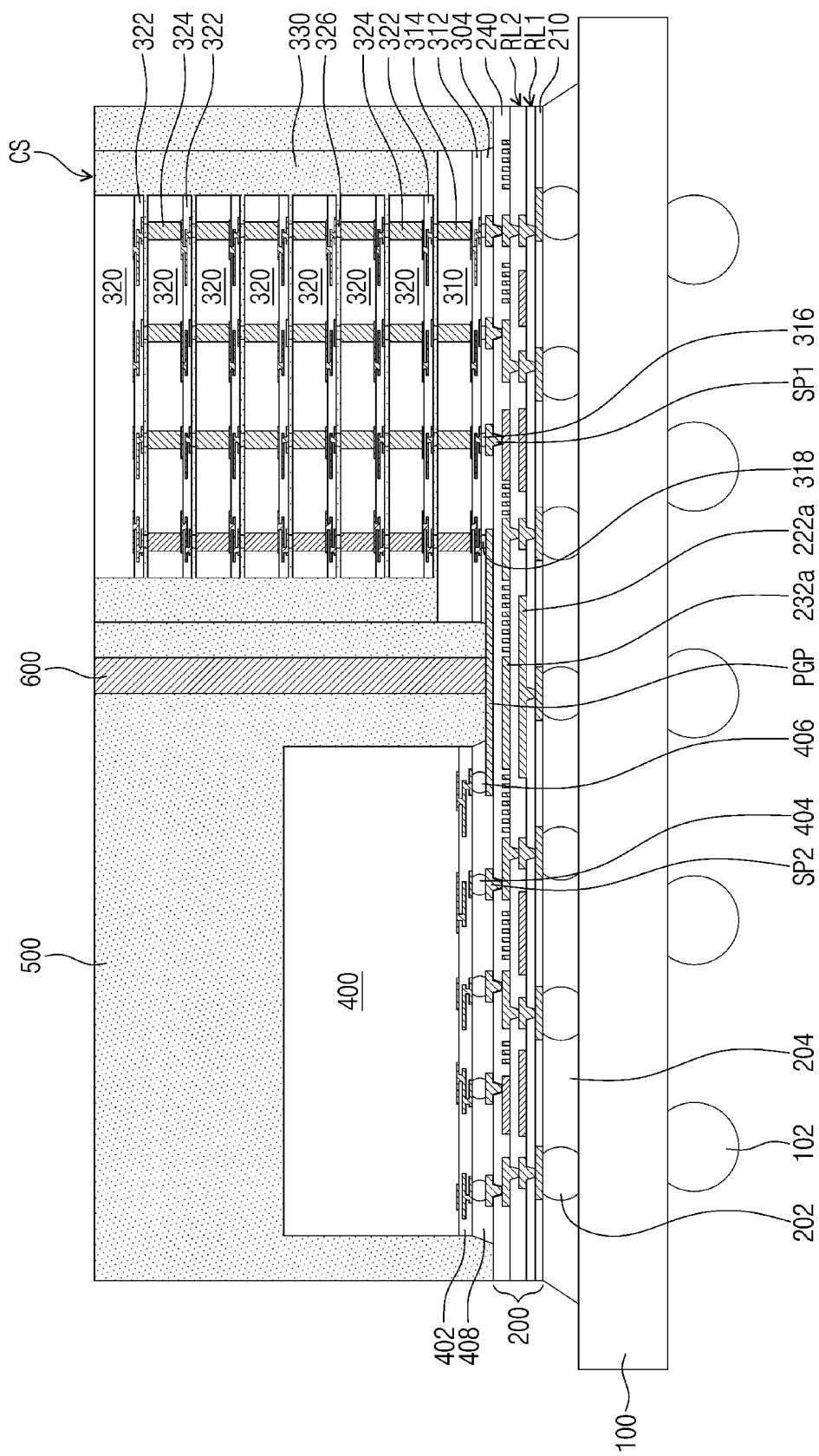
Figure 11:
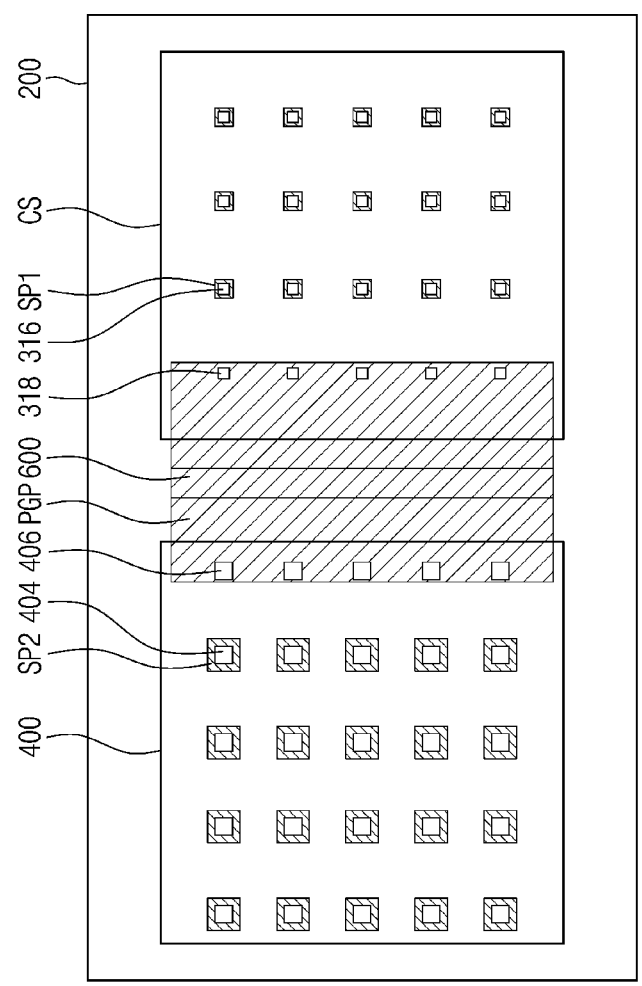
FIG. 11 is a plan view showing a semiconductor package according to some embodiments of the present inventive concept.

FIG. 10 is a cross-sectional view showing a semiconductor package according to some embodiments of the present inventive concept. FIG. 11 is a plan view showing a semiconductor package according to some embodiments of the present inventive concept.

Referring to FIGS. 10 and 11, a semiconductor package may further include a shielding member 600. The shielding member 600 may be disposed on the interposer 200. The shielding member 600 may have a partition shape that divides a region where the chip stack CS is disposed on the interposer 200 from a region where the second semiconductor chip 400 is disposed on the interposer 200. When viewed in a plan view, the shielding member 600 may extend to run across between the chip stack CS and the second semiconductor chip 400, such that the chip stack CS and the second semiconductor chip 400 may be isolated from each other.

The shielding member 600 may be mounted on the interposer 200. For example, the shielding member 600 may be connected to a portion of the power/ground pad PGP positioned between the chip stack CS and the second semiconductor chip 400. For example, the shielding member 600 may be directly connected to the power/ground pad PGP. In this case, the shielding member 600 may extend from the top surface of the power/ground pad PGP and between the chip stack CS and the second semiconductor chip 400. The shielding member 600 may be electrically connected through the power/ground pad PGP to an external ground circuit.

According to some embodiments of the present inventive concept, the shielding member 600 may prevent electromagnetic interference between the chip stack CS and the second semiconductor chip 400, and since the shielding member 600 is grounded through the power/ground pad PGP, the shielding member 600 may increase in electromagnetic shielding effect. In addition, since the shielding member 600 is formed of metal, the shielding member 600 may absorb heat at a central portion of the interposer 200 to thereby discharge the heat outwardly from a semiconductor package. For example, the shielding member 600 may cause the semiconductor package to have improved electrical properties and increased thermal radiation efficiency.

Figure 12:
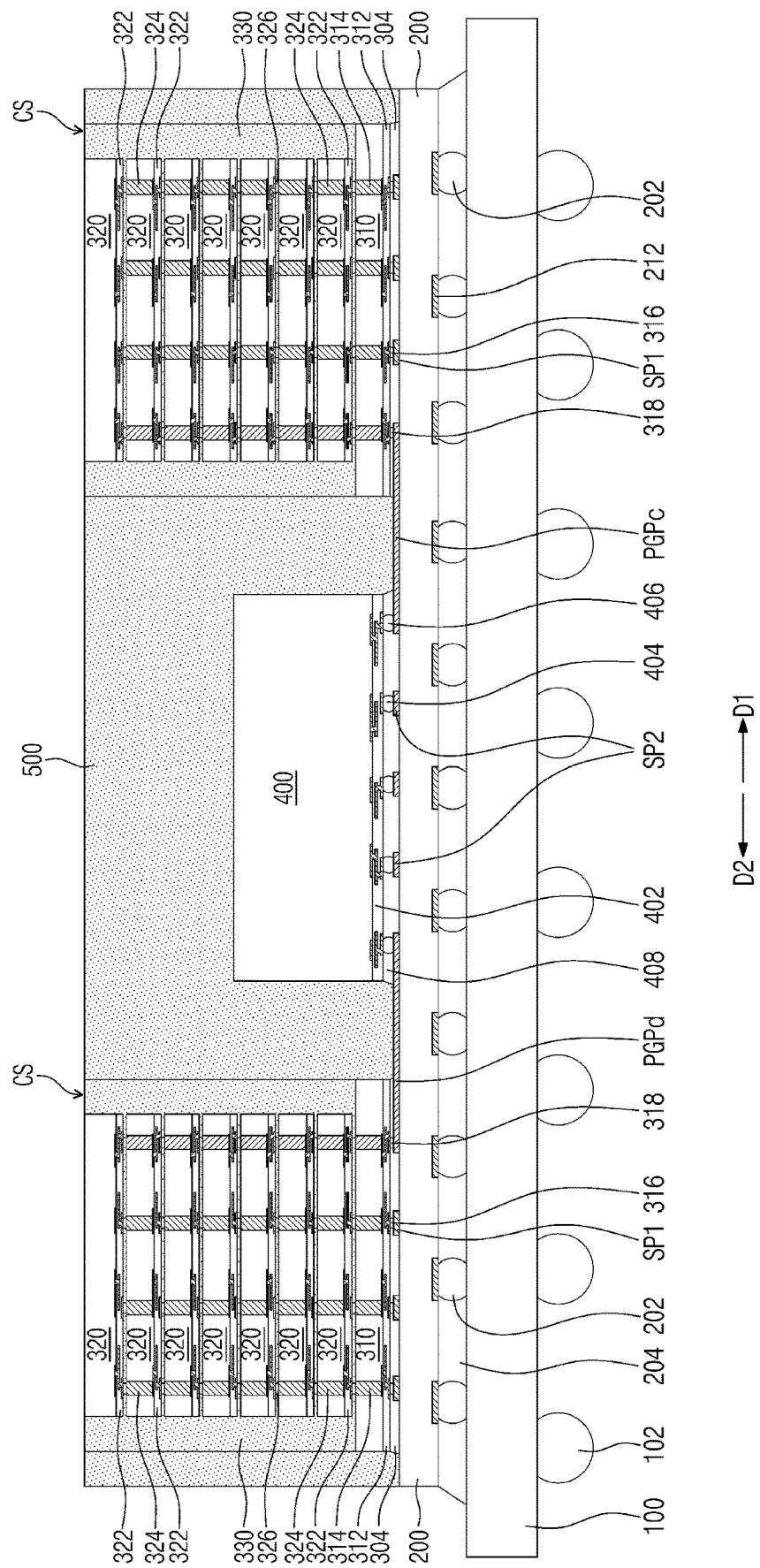
FIG. 12 is a cross-sectional view showing a semiconductor package according to some embodiments of the present inventive concept.
Figure 13:
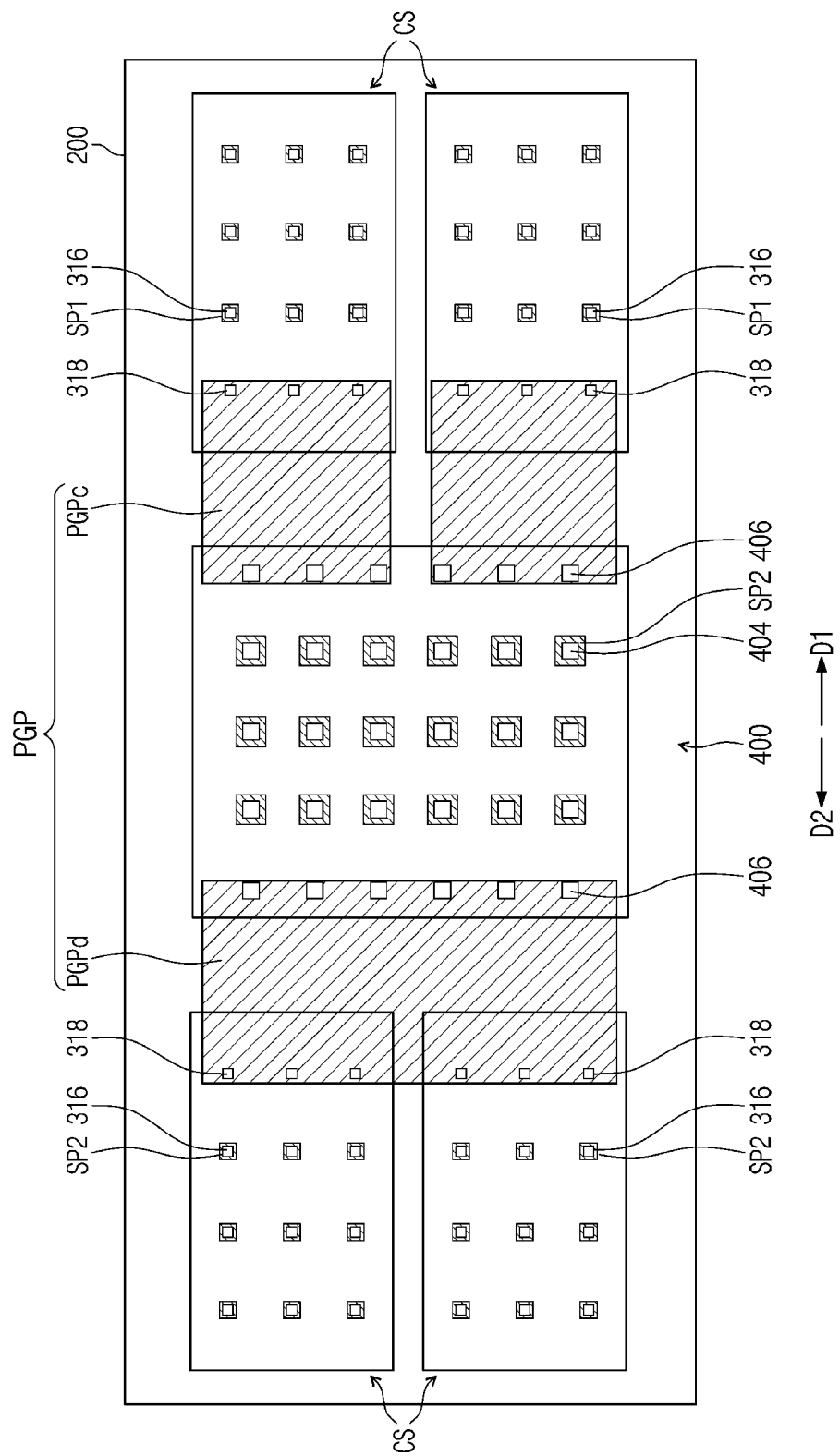
FIG. 13 is a plan view showing a semiconductor package according to some embodiments of the present inventive concept.

FIG. 12 is a cross-sectional view showing a semiconductor package according to some embodiments of the present inventive concept. FIG. 13 is a plan view showing a semiconductor package according to some embodiments of the present inventive concept.

Referring to FIGS. 12 and 13, the chip stack CS may be provided in plural. The chip stacks CS may be spaced apart from each other on the interposer 200. When viewed in a plan view, the second semiconductor chip 400 may be disposed between the chip stacks CS. For example, the chip stacks CS may be arranged on one side in a first direction D1 of the second semiconductor chip 400 and on another side in a second direction D2 of the second semiconductor chip 400, wherein the second direction D2 is opposite to the first direction D1.

Based on positions of the chip stacks CS, the fourth connection terminals 406 of the second semiconductor chip 400 may be disposed adjacent to one lateral surface in the first direction D1 of the second semiconductor chip 400 or to another lateral surface in the second direction D2 of the second semiconductor chip 400. For example, the fourth connection terminals 406 may be disposed adjacent to lateral surfaces of the second semiconductor chip 400 that are directed toward the chip stacks CS. The second connection terminals 318 of the chip stacks CS may be disposed adjacent to lateral surfaces of the chip stacks CS, wherein the lateral surfaces of the chip stacks CS are directed toward the second semiconductor chip 400.

The power/ground pad PGP may be provided in plural, e.g., PGPc and PGPd. For example, the power/ground pad PGP may be disposed between at least one chip stack CS and the second semiconductor chip 400. For example, the power/ground pad PGP may be in direct contact with the second molding layer 500 in an area between at least one chip stack CS and the second semiconductor chip 400. Each of power/ground pads PGPc and PGPd may be a common power/ground pad for one chip stack CS and the second semiconductor chip 400. For example, each of power/ground pads PGPc and PGPd may connect the second connection terminals 318 of one chip stack CS to the fourth connection terminals 406 of the second semiconductor chip 400. Alternatively, each of power/ground pads PGPc and PGPd may be a common power/ground pad for at least two chip stacks CS and the second semiconductor chip 400. For example, each of power/ground pads PGPc and PGPd may connect the second connection terminals 318 of two or more adjacent chip stacks CS to the fourth connection terminals 406 of the second semiconductor chip 400. In this case, each of the chip stacks CS may be connected to a corresponding one of the power/ground pads PGP, and the second semiconductor chip 400 may be connected to all of the power/ground pads PGP.

FIGS. 14 to 20 are cross-sectional views showing a method of fabricating a semiconductor package according to some embodiments of the present inventive concept.

Referring to FIG. 14, a carrier substrate 700 may be provided. The carrier substrate 700 may be a dielectric substrate including glass or polymer, or may be a conductive substrate including metal. The carrier substrate 700 may be provided with an adhesive member on a top surface of the carrier substrate 700. For example, the adhesive member may include a glue tape.

The first dielectric layer 210 may be provided on the carrier substrate 700. The first dielectric layer 210 may include a dielectric polymer or a photo-imagable dielectric (PID).

First substrate pads 212 may be formed in the first dielectric layer 210. For example, the first dielectric layer 210 may be patterned to form openings for forming the first substrate pads 212 and a plating process may be performed in which a seed layer conformally formed in the openings is used as a seed to form the first substrate pads 212 that fill the openings.

Alternatively, the first substrate pads 212 may be formed by forming a sacrificial layer on a seed layer formed on the carrier substrate 700, patterning the sacrificial layer to form openings for forming the first substrate pads 212, and then performing a plating process in which the seed layer is used as a seed to form the first substrate pads 212 that fill the openings. Afterwards, the sacrificial layer may be removed, and then the first substrate pads 212 may be used as a mask to pattern the seed layer. After that, on the carrier substrate 700, the first dielectric layer 210 may be formed to surround the first substrate pads 212.

A first dielectric pattern 220 may be formed on the first dielectric layer 210. The first dielectric pattern 220 may be formed by a coating process such as spin coating or slit coating. The first dielectric pattern 220 may include a photo-imagable dielectric (PID).

Openings or horizontally extending trenches may be formed on the first dielectric pattern 220, wherein the openings or trenches expose the first substrate pads 212. A conductive layer may be formed on the first dielectric pattern 220. The conductive layer may fill the opening or the trenches and may cover a top surface of the first dielectric pattern 220. The conductive layer may be formed by performing an electroplating process in which a seed layer conformally covering the first dielectric pattern 220 is used as a seed. The conductive layer may include metal such as copper and may extend onto the top surface of the first dielectric pattern 220. The conductive layer may undergo a patterning process to form a first wiring pattern 222. A patterning process may be performed to expose the top surface of the first dielectric pattern 220. The planarization process may be performed until the top surface of the first dielectric pattern 220 is exposed. Therefore, there may be formed a first wiring layer RL1 that has the first dielectric pattern 220 and the first wiring pattern 222.

A second wiring layer RL2 may be formed on the first wiring layer RL1. The second wiring layer RL2 may be directly on the first wiring layer RL1. The formation of the second wiring layer RL2 may be substantially the same as or similar to the formation of the first wiring layer RL1. For example, a second dielectric pattern 230 may be formed on the first wiring layer RL1. The second dielectric pattern 230 may cover the first wiring pattern 222 on the first dielectric pattern 220 of the first wiring layer RL1. An opening may be formed in the second dielectric pattern 230, exposing the first wiring pattern 222 of the first wiring layer RL1. A conductive layer may be formed on the second dielectric pattern 230, filling the opening and covering the second dielectric pattern 230. The conductive layer may be patterned to form a second wiring pattern 232.

A second dielectric layer 240 may be formed on the second wiring layer RL2. The second dielectric layer 240 may be formed by a coating process such as spin coating or slit coating. The second dielectric layer 240 may include a photo-imagable dielectric (PID). For example, the photo-imagable dielectric may include at least one selected from photosensitive polyimide, polybenzoxazole (PBO), phenolic polymers, and benzocyclobutene polymers.

Referring to FIG. 15, first openings OP1 may be formed in the second dielectric layer 240. For example, a mask pattern may be formed on the second dielectric layer 240, and then the second dielectric layer 240 may be patterned to form the first openings OP1. The first openings OP1 may expose the second wiring pattern 232 of the second wiring layer RL2. Afterward, the mask pattern may be removed.

A seed layer 252 may be formed on the second dielectric layer 240. The seed layer 252 may conformally cover the second dielectric layer 240. For example, the seed layer 252 may cover a top surface of the second dielectric layer 240, inner lateral surfaces of the first openings OP1, and bottom surfaces of the first openings OP1. The seed layer 252 may include gold (Au), silver (Ag), nickel (Ni), tungsten (W), or the like.

A barrier layer may be formed to replace the seed layer 252. The barrier layer may include a metal nitride layer or a multiple layer of a metal layer and a metal nitride layer. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. Alternatively, a multiple layer may be formed which includes both of the seed layer 252 and the barrier layer.

A conductive layer 254 may be formed on the seed layer 252. For example, the seed layer 252 may be used as a seed to perform a plating process to form the conductive layer 254 that covers the top surface of the second dielectric layer 240 and fills the first openings OP1.

Figure 16:
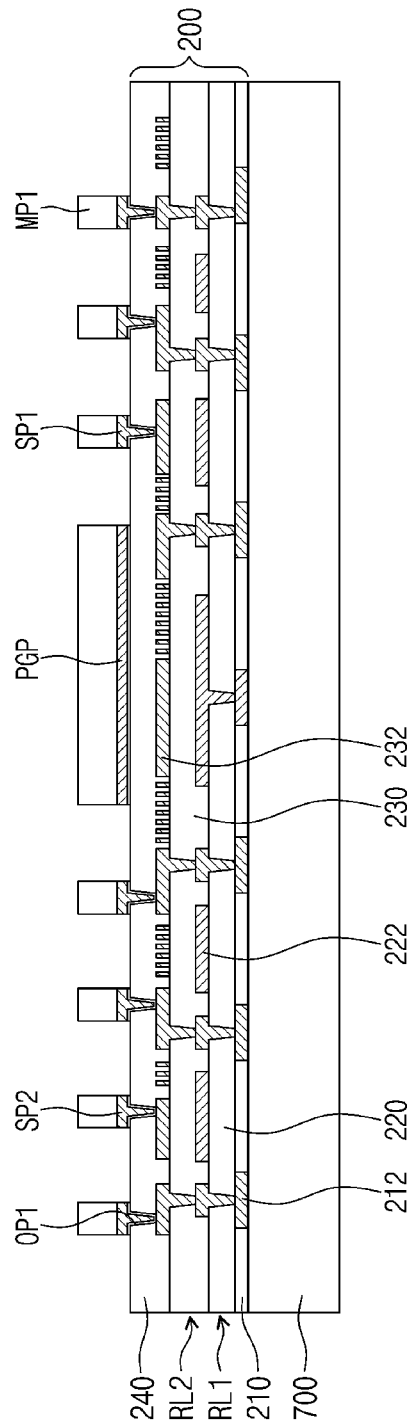

Referring to FIG. 16, a first mask pattern MP1 may be formed on the conductive layer 254. The first mask pattern MP1 may define regions where second substrate pads SP1, SP2, and PGP will be formed. The conductive layer 254 may undergo an etching process in which the first mask pattern MP1 is used as an etching mask to form the second substrate pads SP1, SP2, and PGP. Therefore, an interposer 200 may be formed.

The conductive layer 254 may be patterned to simultaneously form a power/ground pad PGP and first and second signal pads SP1 and SP2, and thus the power/ground pad PGP and the first and second signal pads SP1 and SP2 may be formed to have their top surfaces located at the same level. For example, the top surfaces of the power/ground pad PGP and the first and second signal pads SP1 and SP2 may be coplanar with each other.

According to some embodiments of the present inventive concept, the power/ground pad PGP may be formed in a process for forming the first and second signal pads SP1 and SP2. Therefore, a top surface of the interposer 200 is not required to undergo a separate process to form a common power/ground pad for a chip stack (see CS of FIG. 1) and a second semiconductor chip (see 400 of FIG. 1), and thus, it is possible to simplify a method of fabricating a semiconductor package.

FIGS. 15 and 16 depict that the conductive layer 254 is formed, and thereafter the conductive layer 254 is patterned to form the second substrate pads SP1, SP2, and PGP, but the present inventive concept is not limited thereto.

Figure 17:
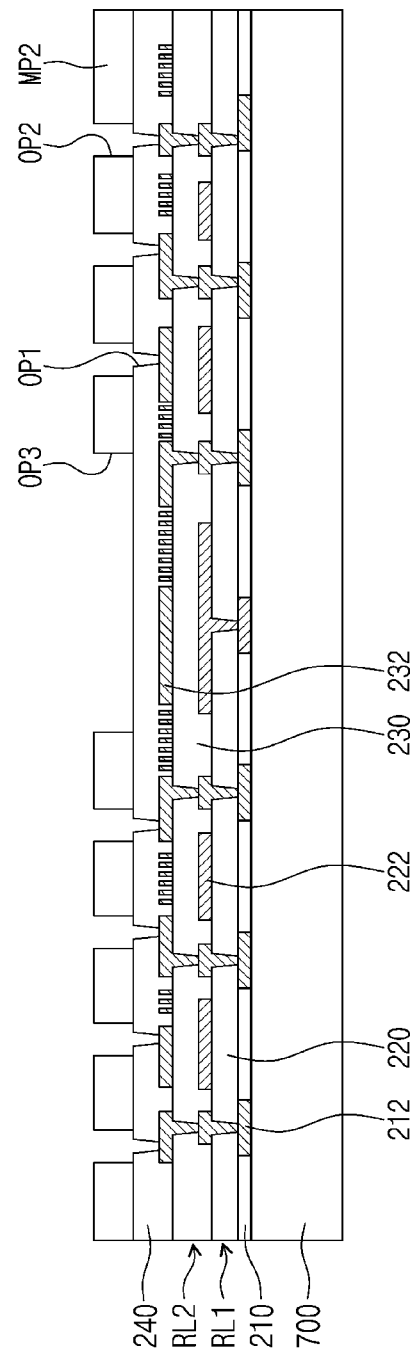

Referring to FIG. 17, on a resultant structure of FIG. 14, first openings OP1 may be formed in the second dielectric layer 240. For example, a mask pattern may be formed on the second dielectric layer 240, and then the second dielectric layer 240 may be patterned to form the first openings OP1. The first openings OP1 may expose the second wiring pattern 232 of the second wiring layer RL2. Afterward, the mask pattern may be removed.

A second mask pattern MP2 may be formed on the second dielectric layer 240. The second mask pattern MP2 may have second openings OP2 and a third opening OP3. The second openings OP2 may be positioned on the first openings OP1, and the first openings OP1 and the second openings OP2 may define regions where first and second signal pads (see SP1 and SP2 of FIG. 1) will be formed. The third opening OP3 may define a region where a power/ground pad (see PGP of FIG. 1) will be formed.

Figure 18:
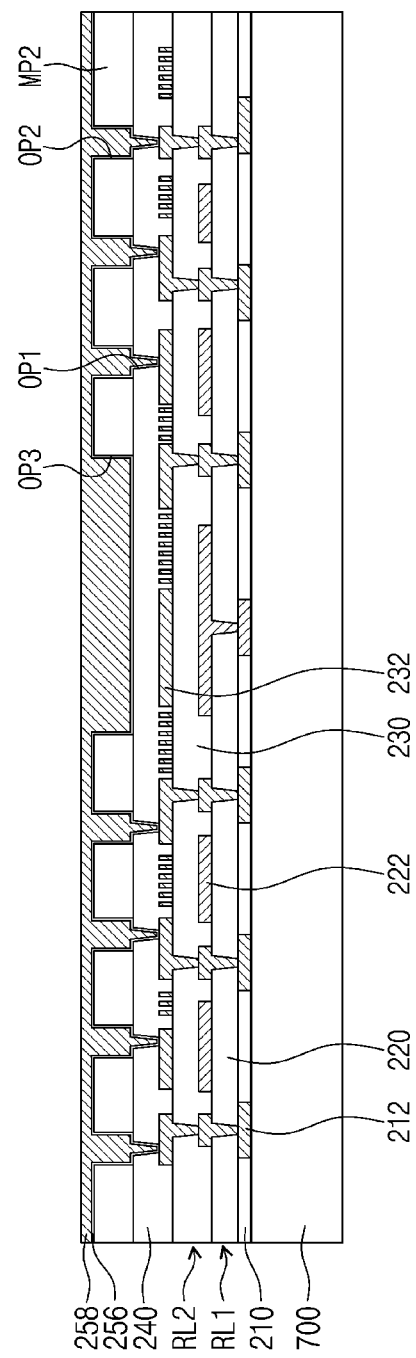

Referring to FIG. 18, a seed layer 256 may be formed on the second mask pattern MP2. The seed layer 256 may conformally cover the second mask pattern MP2. For example, the seed layer 256 may cover a top surface of the second mask pattern MP2, inner lateral surfaces of the second openings OP2, inner lateral surfaces and bottom surfaces of the first openings OP1, and an inner lateral surface and a bottom surface of the third opening OP3. The seed layer 256 may include gold (Au), silver (Ag), nickel (Ni), tungsten (W), or the like. A barrier layer may be formed in place of the seed layer 256, or a multiple layer may be formed which includes both of the seed layer 256 and the barrier layer.

A conductive layer 258 may be formed on the seed layer 256. For example, the seed layer 256 may be used as a seed to perform a plating process to form the conductive layer 258 that covers a top surface of the second mask pattern MP2 and fills the first openings OP1, the second openings OP2, and the third opening OP3.

Figure 19:
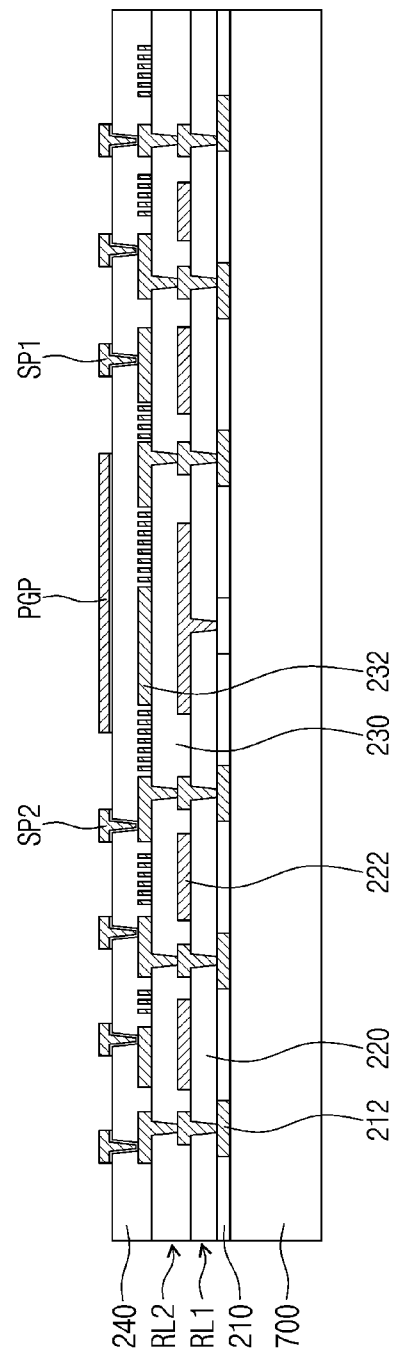

Referring to FIG. 19, a planarization process may be performed on the conductive layer 258 until the top surface of the second mask pattern MP2 is exposed. The planarization process may include an etch-back process or a chemical mechanical polishing (CMP) process. The planarization process may divide the conductive layer 258 into second substrate pads SP1, SP2, and PGP. For example, the conductive layer 258 remaining in the first openings OP1 and the second openings OP2 may constitute first signal pads SP1 and second signal pads SP2, and the conductive layer 258 that remains in the third opening OP3 may constitute a power/ground pad PGP.

The conductive layer 258 may be patterned to simultaneously form the power/ground pad PGP and the first and second signal pads SP1 and SP2, and thus the power/ground pad PGP and the first and second signal pads SP1 and SP2 may be formed to have their top surfaces located at the same level. In other words, the top surfaces of the power/ground pad PGP and the first and second signal pads SP1 and SP2 may be coplanar with each other. The following description will focus on the embodiment of FIGS. 15 and 16.

Figure 20:
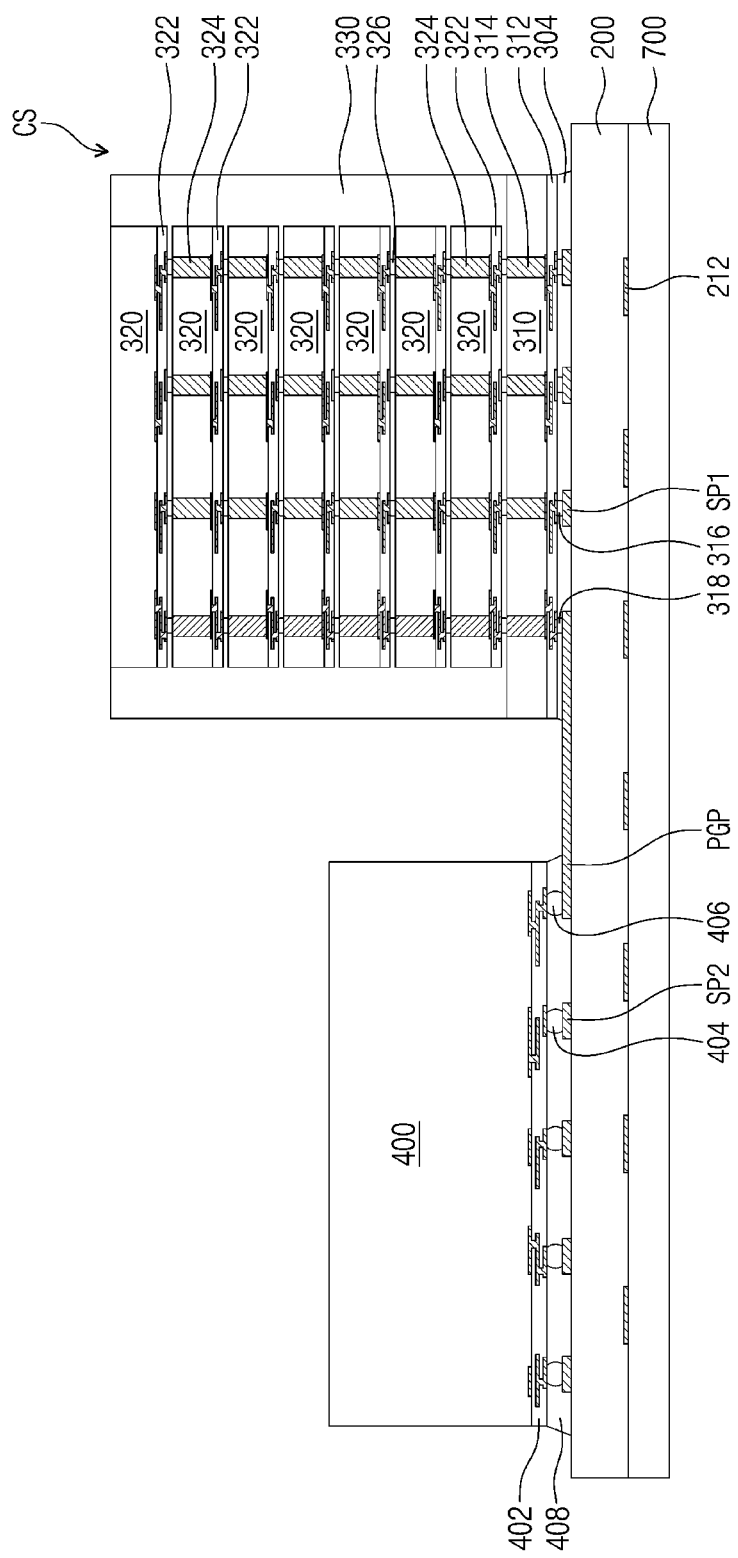

Referring to FIG. 20, on a result structure of FIG. 16, a chip stack CS and a second semiconductor chip 400 may be provided on the interposer 200. The chip stack CS and the second semiconductor chip 400 may be the same as or similar to those discussed with reference to FIG. 1. For example, the chip stack CS may include a base substrate, first semiconductor chips 320 stacked on the base substrate, and a first molding layer 330 that surrounds the first semiconductor chips 320. The chip stack CS and the second semiconductor chip 400 may be mounted on the interposer 200.

The chip stack CS may be flip-chip mounted on the interposer 200. The chip stack CS may include first connection terminals 316 and second connection terminals 318 on its bottom surface. The first connection terminals 316 and the second connection terminals 318 may include a solder ball or a solder bump. The chip stack CS may include a second under-fill layer 304 on its bottom surface that surrounds the first connection terminals 316 and the second connection terminals 318. For example, the second under-fill layer 304 may be a non-conductive adhesive or a non-conductive film. When the second under-fill layer 304 is a non-conductive adhesive, the second under-fill layer 304 may be formed by dispensing a liquid non-conducive adhesive to coat the chip stack CS. When the second under-fill layer 304 is a non-conductive film, the second under-fill layer 304 may be formed by attaching a non-conductive film to the chip stack CS. The first connection terminals 316 may be coupled to the first signal pads SP1 of the interposer 200. The second connection terminals 318 may be coupled to the power/ground pad PGP of the interposer 200.

The second semiconductor chip 400 may be flip-chip mounted on the interposer 200. The second semiconductor chip 400 may include third connection terminals 404 and fourth connection terminals 406 on its bottom surface. The third connection terminals 404 and the fourth connection terminals 406 may include a solder ball or a solder bump. The second semiconductor chip 400 may include a third under-fill layer 408 on its bottom surface that surrounds the third connection terminals 404 and the fourth connection terminals 406. The third connection terminals 404 may be coupled to the second signal pads SP2 of the interposer 200. The fourth connection terminals 406 may be coupled to the power/ground pad PGP of the interposer 200.

Referring back to FIG. 1, a second molding layer 500 may be formed. For example, the interposer 200 may be coated thereon with a dielectric material to form the second molding layer 500. The second molding layer 500 may cover the chip stack CS and the second semiconductor chip 400. Afterwards, a grinding process may be performed on the second molding layer 500. An upper portion of the second molding layer 500 may be removed. A top surface of the second molding layers 500 may be coplanar with that of the chip stack CS.

The interposer 200 may be mounted on a package substrate 100. For example, the carrier substrate 700 may be removed to expose a bottom surface of the interposer 200. The interposer 200 may be flip-chip mounted on the package substrate 100. For example, substrate terminals 202 may be provided on the bottom surface of the interposer 200. The substrate terminals 202 may be provided on the first substrate pads 212 of the interposer 200. The substrate terminals 202 may be coupled to pads of the package substrate 100. A first under-fill layer 204 may be formed between the interposer 200 and the package substrate 100. For example, the interposer 200 may include the first under-fill layer 204 on its bottoms surface that surrounds the substrate terminals 202, and then the interposer 200 may be mounted on the package substrate 100.

The package substrate 100 may be provided with external terminals 102 on a bottom surface thereof. For example, the external terminals 102 may be disposed on terminal pads provided on the bottom surface of the package substrate 100. The external terminals 102 may include a solder ball or a solder bump.

As such, a semiconductor package of FIG. 1 may be fabricated.

In a semiconductor package according to some embodiments of the present inventive concept, a chip stack and a semiconductor chip may be simultaneously connected to one power/ground pad, and thus it is possible to achieve simplification of ground and/or power lines in the interposer. For example, a power/ground pattern may have a small volume in the interposer, and thus, there is provided a semiconductor package including the interposer having a small size and a high degree of freedom of wiring design.

In addition, a signal pattern of the interposer may be positioned between a power/ground pattern and a power/ground pad. The power/ground pad and the power/ground pattern disposed adjacent to the signal pattern may serve as a return path of the signal pattern, and electromagnetic waves may be effectively shielded to significantly reduce crosstalk to the signal pattern. As a result, there is provided a semiconductor package whose electrical properties are improved.

Although the present inventive concept has been described in connection with some embodiments thereof, it will be understood by one of ordinary skill in the art that variations in form and detail may be made thereto without departing from the spirit and scope of the present inventive concept. The above disclosed embodiments should thus be considered illustrative and not restrictive.

What is claimed is:

1. A semiconductor package, comprising:
a package substrate;
an interposer on the package substrate;
a chip stack on the interposer, the chip stack including a plurality of first semiconductor chips that are stacked in a first direction;
a second semiconductor chip on the interposer and spaced apart from the chip stack in a second direction intersecting the first direction; and
a first signal pad, a second signal pad, and a power/ground pad on a top surface of the interposer,
wherein the chip stack is mounted on the first signal pad,
wherein the second semiconductor chip is mounted on the second signal pad,
wherein the chip stack and the second semiconductor chip are connected to the power/ground pad, and
wherein the power/ground pad overlaps a portion of the chip stack and a portion of the second semiconductor chip.

2. The semiconductor package of claim 1, wherein a top surface of the power/ground pad at a same level a top surface of the first signal pad and a top surface of the second signal pad.

3. The semiconductor package of claim 1, wherein the power/ground pad, the first signal pad, and the second signal pad protrude from the top surface of the interposer.

4. The semiconductor package of claim 1, wherein the interposer includes:
a first wiring layer that has a first dielectric pattern and a power/ground pattern in the first dielectric pattern; and
a second wiring layer on the first wiring layer, the second wiring layer having a second dielectric pattern and a signal pattern in the second dielectric pattern,
wherein the power/ground pad vertically overlaps the signal pattern.

5. The semiconductor package of claim 4, wherein the signal pattern is between the power/ground pattern and the power/ground pad.

6. The semiconductor package of claim 4, wherein the power/ground pad, the first signal pad, and the second signal pad are on a top surface of the second dielectric pattern.

7. The semiconductor package of claim 4, wherein
each of the first wiring layer and the second wiring layer is provided in plural,
the plurality of first wiring layers are stacked alternately with the plurality of second wiring layers,
one of the plurality of second wiring layers is a topmost wiring layer of the interposer, and
the power/ground patterns of the plurality of first wiring layers overlap the signal patterns of the plurality of second wiring layers.

8. The semiconductor package of claim 1, wherein, when viewed in a plan view, the power/ground pad covers a region between the chip stack and the second semiconductor chip.

9. The semiconductor package of claim 1, wherein the chip stack further includes a plurality of dummy bumps that are on bottom surfaces of the plurality of first semiconductor chips and are electrically insulated from the plurality of first semiconductor chips,
wherein the dummy bump on the bottom surface of a lowermost one of the plurality of first semiconductor chips is connected to the power/ground pad.

10. The semiconductor package of claim 9, wherein
the dummy bumps are adjacent to a lateral surface of the chip stack, the lateral surface adjacent to the second semiconductor chip, and
the dummy bumps are connected to each other through a plurality of dummy through electrodes that penetrate the plurality of first semiconductor chips.

11. The semiconductor package of claim 1, further comprising a shielding member connected to a top surface of the power/ground pad,
wherein the shielding member extends from the top surface of the power/ground pad and is disposed between the chip stack and the second semiconductor chip.

12. The semiconductor package of claim 1, wherein
the chip stack is connected to the first signal pad through a first solder ball and to the power/ground pad through a second solder ball, and
the second semiconductor chip is connected to the second signal pad through a third solder ball and to the power/ground pad through a fourth solder ball.

13. The semiconductor package of claim 1, wherein
the chip stack is provided in plural, the plurality of chip stacks being spaced apart from each other on the interposer,
the second semiconductor chip is between the plurality of chip stacks,
the power/ground pad is provided in plural, each of the plurality of power/ground pads being between the second semiconductor chip and one of the chip stacks,
each of the plurality of chip stacks is connected to one of the plurality of power/ground pads, and
the second semiconductor chip is connected to each of the plurality of power/ground pads.

14. The semiconductor package of claim 1, wherein
the first semiconductor chips include a memory chip, and
the second semiconductor chip includes a logic chip.

15. A semiconductor package, comprising:
a package substrate;
an interposer on the package substrate;
a chip stack on the interposer, the chip stack including a plurality of first semiconductor chips that are stacked on each other; and
a second semiconductor chip on the interposer and spaced apart from the chip stack,
wherein the interposer includes:
a first wiring layer that has a power/ground pattern;
a second wiring layer on the first wiring layer, the second wiring layer having a signal pattern; and a first signal pad and a first power/ground pad disposed on the second wiring layer and on which the chip stack is mounted;
a second signal pad and a second power/ground pad disposed on the second wiring layer and on which the second semiconductor chip is mounted; and
a connection pattern that electrically connects the first power/ground pad to the second power/ground pad,
wherein the connection pattern vertically overlaps the signal pattern of the second wiring layer.

16. The semiconductor package of claim 15, wherein the first power/ground pad, the second power/ground pad, and the connection pattern constitute a power/ground pad that is provided in a single unitary piece, and
when viewed in a plan view, the power/ground pad covers a region between the chip stack and the second semiconductor chip.

17. The semiconductor package of claim 16, wherein the power/ground pad overlaps a portion of the chip stack and a portion of the second semiconductor chip.

18. The semiconductor package of claim 15, wherein the connection pattern bas a linear shape that connects the first power/ground pad to the second power/ground pad.

19. The semiconductor package of claim 15, wherein the first signal pad, the first power/ground pad, the second signal pad and the second power/ground pad protrude from a top surface of the second wiring layer.

20. The semiconductor package of claim 15, wherein the signal pattern of the second wiring layer is between the power/ground pattern of the first wiring layer and the connection pattern.

21. The semiconductor package of claim 15, wherein the first signal pad, the first power/ground pad, the second signal pad, the second power/ground pad, and the connection pattern have top surfaces at the same level.

22. The semiconductor package of claim 15, wherein the plurality of first semiconductor chips include a plurality of dummy through electrodes that penetrate the plurality of first semiconductor chips and are electrically insulated from integrated circuits of the plurality of first semiconductor chips,
wherein the dummy through electrodes are connected to the second power/ground pad.

23. The semiconductor package of claim 15, further comprising a shielding member connected to a top surface of the connection pattern,
wherein the shielding member extends from the top surface of the connection pattern to an area between the chip stack and the second semiconductor chip.

24. The semiconductor package of claim 15, wherein
the chip stack is connected to the first signal pad through a first solder ball and to the first power/ground pad through a second solder ball, and
the second semiconductor chip is connected to the second signal pad through a third solder ball and to the second power/ground pad through a fourth solder ball.

25. A semiconductor package, comprising:
a package substrate;
an interposer on the package substrate;
a chip stack on the interposer, the chip stack including a plurality of memory chips that are stacked in a first direction; and
a logic chip on the interposer and spaced apart from the chip stack in a second direction different from the first direction,
wherein the chip stack and the logic chip are on signal pads of the interposer,
wherein a first power/ground terminal of the chip stack and a second power/ground terminal of the logic chip are connected to an intermediate pattern of the interposer,
wherein the signal pads and the intermediate pattern protrude from a top surface of the interposer, and
wherein top surfaces of the signal pads are at a level the same as a level of a top surface of the intermediate pattern.

26. The semiconductor package of claim 25, further comprising a first power/ground pad and a second power/ground pad that are on the top surface of the interposer,
wherein the first power/ground terminal of the chip stack is directly connected to the first power/ground pad,
wherein the second power/ground terminal of the logic chip is directly connected to the second power/ground pad, and
wherein the first power/ground pad and the second power/ground pad are connected to each other through the intermediate pattern.

27. The semiconductor package of claim 25, wherein the first power/ground terminal of the chip stack and the second power/ground terminal of the logic chip are directly connected to the intermediate pattern.

28. The semiconductor package of claim 27, wherein the intermediate pattern penetrates a portion of the chip stack and a portion of the logic chip.

29. The semiconductor package of claim 25, wherein the interposer includes:
a first wiring layer that has a first dielectric pattern and a power/ground pattern in the first dielectric pattern; and
a second wiring layer on the first wiring layer, the second wiring layer having a second dielectric pattern and a signal pattern in the second dielectric pattern,
wherein the intermediate pattern vertically overlaps the signal pattern.

30. The semiconductor package of claim 29, wherein the signal pads and the intermediate pattern are on a top surface of the second dielectric pattern.

31. The semiconductor package of claim 29, wherein
the intermediate pattern is coupled to the power/ground pattern of the first wiring layer, and
the intermediate pattern is electrically connected to the first power/ground terminal of the chip stack and to the second power/ground terminal of the logic chip.

32. The semiconductor package of claim 25, further comprising a first power/ground pad and a second power/ground pad on the top surface of the interposer,
wherein the first power/ground terminal of the chip stack is directly connected to the first power/ground pad,
wherein the second power/ground terminal of the logic chip is directly connected to the second power/ground pad,
wherein the intermediate pattern is spaced apart from the first power/ground pad and the second power/ground pad, and
wherein the intermediate pattern is electrically connected to the first power/ground pad and the second power/ground pad.

33. A semiconductor package, comprising:
an interposer on a package substrate;
a chip stack on the interposer; and
a semiconductor chip on the interposer and horizontally spaced apart from the chip stack,
wherein the interposer includes:
a first wiring layer that has a power/ground pattern;

a second wiring layer on the first wiring layer, the second wiring layer having a signal pattern;
a first signal pad and a first power/ground pad disposed on the second wiring layer and on which the chip stack is mounted;
a second signal pad and a second power/ground pad disposed on the second wiring layer and on which the semiconductor chip is mounted; and
an intermediate pattern between the first power/ground pad and the second power/ground pad, the intermediate pattern being electrically connected to the first and second power/ground pads,
wherein the intermediate pattern vertically overlaps the signal patterns of the second wiring layer, and
wherein the first and second signal pads, the first and second power/ground pads, and the intermediate pattern have top surfaces at the same level.

* * * * *